United States Patent
Chen et al.

(10) Patent No.: US 11,967,594 B2
(45) Date of Patent: Apr. 23, 2024

(54) SEMICONDUCTOR DEVICE STRUCTURE AND METHODS OF FORMING THE SAME

(71) Applicant: TAIWAN SEMICONDUCTOR MANUFACTURING COMPANY, LTD., Hsinchu (TW)

(72) Inventors: Shih-Cheng Chen, New Taipei (TW); Zhi-Chang Lin, Hsinchu (TW); Jung-Hung Chang, Changhua (TW); Lo Heng Chang, Hsinchu (TW); Chien Ning Yao, Hsinchu (TW); Kuo-Cheng Chiang, Hsinchu (TW); Chih-Hao Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/884,840

(22) Filed: Aug. 10, 2022

(65) Prior Publication Data
US 2022/0384435 A1 Dec. 1, 2022

Related U.S. Application Data

(63) Continuation of application No. 17/104,891, filed on Nov. 25, 2020, now Pat. No. 11,450,663.

(51) Int. Cl.
*H01L 27/092* (2006.01)
*H01L 21/02* (2006.01)
(Continued)

(52) U.S. Cl.
CPC .... *H01L 27/0922* (2013.01); *H01L 21/02603* (2013.01); *H01L 21/28518* (2013.01);
(Continued)

(58) Field of Classification Search
CPC ........... H01L 27/0922; H01L 21/02603; H01L 21/28518; H01L 21/823807;
(Continued)

(56) References Cited

U.S. PATENT DOCUMENTS 9,209,247 B2    12/2015  Colinge et al.
9,236,267 B2    1/2016   De et al.
(Continued)

*Primary Examiner* — Tong-Ho Kim
(74) *Attorney, Agent, or Firm* — NZ CARR LAW OFFICE

(57) ABSTRACT

A semiconductor device structure, along with methods of forming such, are described. The structure includes a stack of semiconductor layers spaced apart from and aligned with each other, a first source/drain epitaxial feature in contact with a first one or more semiconductor layers of the stack of semiconductor layers, and a second source/drain epitaxial feature disposed over the first source/drain epitaxial feature. The second source/drain epitaxial feature is in contact with a second one or more semiconductor layers of the stack of semiconductor layers. The structure further includes a first dielectric material disposed between the first source/drain epitaxial feature and the second source/drain epitaxial feature and a first liner disposed between the first source/drain epitaxial feature and the second source/drain epitaxial feature. The first liner is in contact with the first source/drain epitaxial feature and the first dielectric material.

20 Claims, 32 Drawing Sheets

(51) Int. Cl.
    *H01L 21/285*     (2006.01)
    *H01L 21/8238*     (2006.01)
    *H01L 29/06*     (2006.01)
    *H01L 29/423*     (2006.01)
    *H01L 29/45*     (2006.01)
    *H01L 29/66*     (2006.01)
    *H01L 29/786*     (2006.01)

(52) U.S. Cl.
    CPC .............. *H01L 21/823807* (2013.01); *H01L 21/823814* (2013.01); *H01L 21/823871* (2013.01); *H01L 29/0673* (2013.01); *H01L 29/42392* (2013.01); *H01L 29/45* (2013.01); *H01L 29/66545* (2013.01); *H01L 29/66742* (2013.01); *H01L 29/78618* (2013.01); *H01L 29/78696* (2013.01)

(58) Field of Classification Search
    CPC ..... H01L 21/823814; H01L 21/823871; H01L 29/0673; H01L 29/42392; H01L 29/45; H01L 29/66545; H01L 29/66742; H01L 29/78618; H01L 29/78696; H01L 29/775; H01L 21/8221; H01L 21/823878; H01L 27/0688; H01L 27/092; H01L 29/66439; B82Y 10/00

USPC ........................................................ 257/351

See application file for complete search history.

(56) References Cited

U.S. PATENT DOCUMENTS

| | | | |
|---|---|---|---|
| 9,412,817 | B2 | 8/2016 | Yang et al. |
| 9,412,828 | B2 | 8/2016 | Ching et al. |
| 9,472,618 | B2 | 10/2016 | Oxland |
| 9,502,265 | B1 | 11/2016 | Jiang et al. |
| 9,520,482 | B1 | 12/2016 | Chang et al. |
| 9,536,738 | B2 | 1/2017 | Huang et al. |
| 9,576,814 | B2 | 2/2017 | Wu et al. |
| 9,608,116 | B2 | 3/2017 | Ching et al. |
| 9,837,414 | B1 | 12/2017 | Balakrishnan et al. |
| 11,450,663 | B2 * | 9/2022 | Chen .................. H01L 21/02603 |
| 2009/0050941 | A1 * | 2/2009 | Yamazaki ............... H01L 21/84 257/E29.004 |
| 2019/0148376 | A1 * | 5/2019 | Chanemougame .......................... H01L 29/41733 257/532 |
| 2020/0118892 | A1 * | 4/2020 | Cheng ................. H01L 27/1211 |

\* cited by examiner

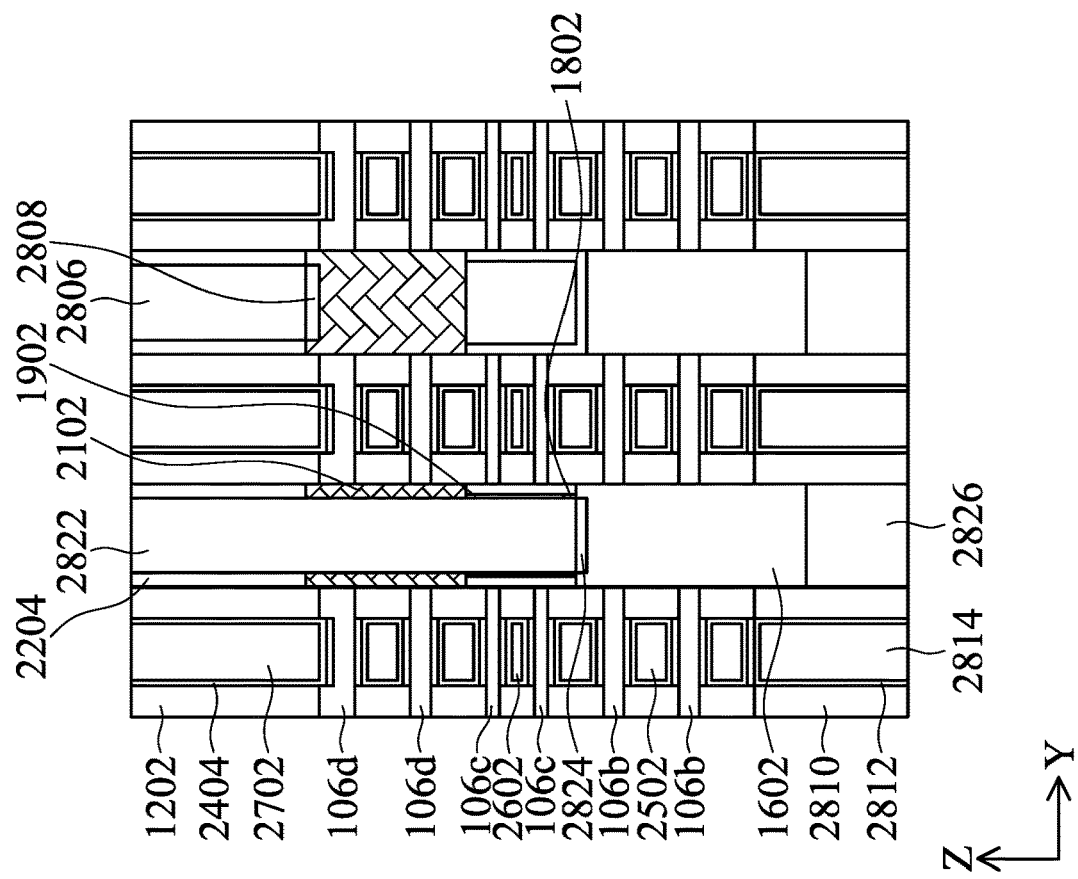
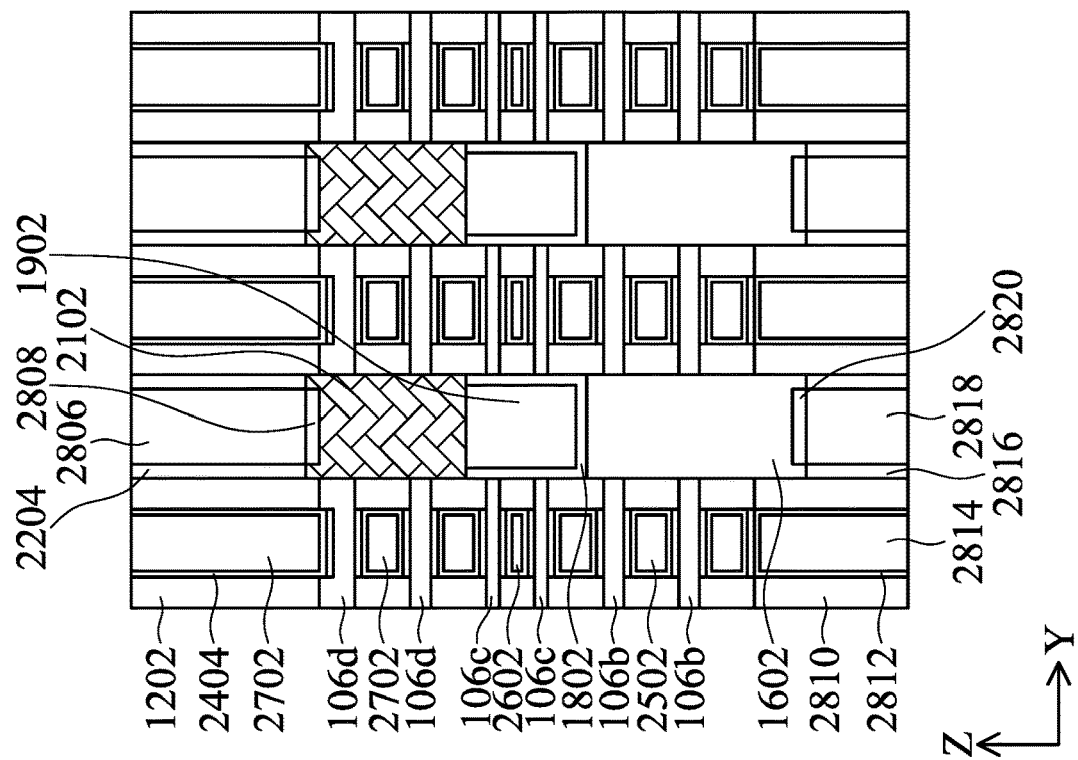

SEMICONDUCTOR DEVICE STRUCTURE AND METHODS OF FORMING THE SAME

CROSS-REFERENCE TO RELATED APPLICATIONS

This application is a continuation application of U.S. patent application Ser. No. 17/104,891 filed Nov. 25, 2020, which is incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

In pursuit of higher device density, higher performance, and lower costs, challenges from both fabrication and design issues have resulted in the development of three-dimensional designs, such as a multi-gate field effect transistor (FET), including a nanosheet FET. In a nanosheet FET, all side surfaces of the channel region are surrounded by the gate electrode, which allows for fuller depletion in the channel region and results in less short-channel effects due to steeper sub-threshold current swing (SS) and smaller drain induced barrier lowering (DIBL). As transistor dimensions are continually scaled down, further improvements of the nanosheet FET are needed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 28A-28B are cross-sectional side views of a stage of manufacturing the semiconductor device structure at different locations on the substrate, in accordance with some embodiments.

DETAILED DESCRIPTION

Figure 1:
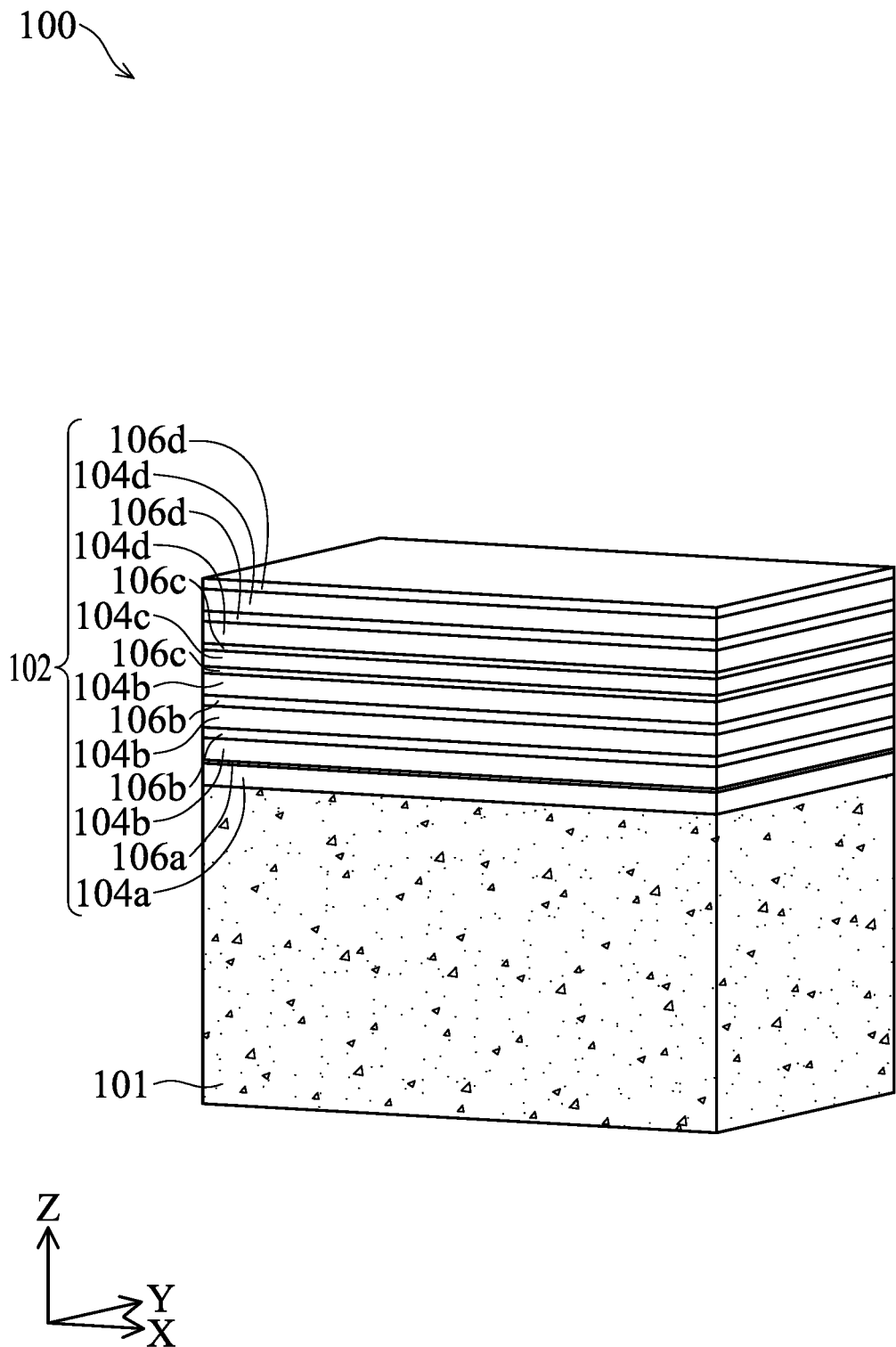
FIGS. 1-12 are perspective views of various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIGS. 1-28B show exemplary sequential processes for manufacturing a semiconductor device structure 100, in accordance with some embodiments. It is understood that additional operations can be provided before, during, and after processes shown by FIGS. 1-28B and some of the operations described below can be replaced or eliminated, for additional embodiments of the method. The order of the operations/processes may be interchangeable.

FIGS. 1-12 are perspective views of various stages of manufacturing a semiconductor device structure, in accordance with some embodiments. As shown in FIG. 1, a stack of semiconductor layers 102 is formed over a substrate 101. The substrate 101 may be a semiconductor substrate. In some embodiments, the substrate 101 includes a single crystalline semiconductor layer on at least the surface of the substrate 101. The substrate 101 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb) and indium phosphide (InP). In this embodiment, the substrate 101 is made of Si. In some embodiments, the substrate 101 is a silicon-on-insulator (SOI) substrate, which includes an insulating layer (not shown) disposed between two silicon layers. In one aspect, the insulating layer is an oxide.

The substrate 101 may include one or more buffer layers (not shown) on the surface of the substrate 101. The buffer layers can serve to gradually change the lattice constant from that of the substrate to that of the source/drain (S/D) regions to be grown on the substrate 101. The buffer layers may be formed from epitaxially grown single crystalline semiconductor materials such as, but not limited to Si, Ge, germanium tin (GeSn), SiGe, GaAs, InSb, GaP, GaSb, InAlAs, InGaAs, GaSbP, GaAsSb, GaN, GaP, and InP. In one embodiment, the substrate 101 includes SiGe buffer layers epitaxially grown on the silicon substrate 101. The germanium concentration of the SiGe buffer layers may increase from 30 atomic percent germanium for the bottom-most buffer layer to 70 atomic percent germanium for the top-most buffer layer.

The substrate 101 may include various regions that have been suitably doped with impurities (e.g., p-type or n-type impurities). The dopants are, for example boron for an n-type field effect transistor FET (NFET) and phosphorus for a p-type FET (PFET).

The stack of semiconductor layers 102 includes first semiconductor layers 104 (104a-104d) and second semiconductor layers 106 (106a-106d). The first semiconductor layers 104 and the second semiconductor layers 106 are made of semiconductor materials having different etch selectivity and/or oxidation rates. For example, the first semiconductor layers 104 are made of Si and the second semiconductor layers 106 are made of SiGe. In some embodiments, the stack of semiconductor layers 102 includes alternating first and second semiconductor layers 104, 106. The second semiconductor layers 106 or portions thereof may form nanosheet channel(s) of the semiconductor device structure 100 at a later stage. The semiconductor device structure 100 may include a nanosheet transistor. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The nanosheet channel(s) of the semiconductor device structure 100 may be surrounded by the gate electrode layer. The nanosheet transistors may be referred to as nanowire transistors, gate-all-around (GAA) transistors, multi-bridge channel (MBC) transistors, or any transistors having the gate electrode layer surrounding the channels. The use of the second semiconductor layers 106 to define a channel or channels of the semiconductor device structure 100 is further discussed below.

In some embodiments, the semiconductor device structure 100 includes a complementary FET (CFET), and the second semiconductor layers 106 includes channels for two or more nanosheet FETs. For example, the second semiconductor layers 106b define the channels of a first FET, such as a PFET, and the second semiconductor layers 106d define the channels of a second FET, such as an NFET. The thickness of the second semiconductor layers 106b, 106d is chosen based on device performance considerations. In some embodiments, each second semiconductor layer 106b, 106d has a thickness ranging from about 7 nanometers (nm) to about 9 nm.

The second semiconductor layer 106a may function as an etch stop layer during back side processes. The second semiconductor layer 106a may have a thickness less than that of the second semiconductor layers 106b or 106d. In some embodiments, the thickness of the second semiconductor layer 106a ranges from about 1 nm to about 2 nm. The second semiconductor layers 106c may function as isolation layers that isolates the gate electrode layers and the dielectric material. The second semiconductor layer 106c may have a thickness less than that of the second semiconductor layers 106b or 106d and greater than that of the second semiconductor layer 106a. In some embodiments, the thickness of the second semiconductor layers 106c ranges from about 2 nm to about 4 nm. The use of the second semiconductor layers 106a, 106b, 106c, 106d to form isolated channels of two FETs is further discussed below.

The first semiconductor layers 104b, 104d may eventually be removed and serve to define spaces for a gate stack to be formed therein. The thickness is chosen based on device performance considerations. In some embodiments, each first semiconductor layer 104b, 104d has a thickness ranging from about 7 nm to about 11 nm. The first semiconductor layer 104c may eventually be removed and serve to define a space for a dielectric stack to be formed therein. The thickness of the first semiconductor layer 104c may be less than that of the first semiconductor layers 104b, 104d. In some embodiments, the first semiconductor layer 104c has a thickness ranging from about 5 nm to about 9 nm. The first semiconductor layer 104a may be eventually removed to define a space for an etch stop layer to be formed therein. The first semiconductor layer 104a may have a composition different from the composition of the first semiconductor layers 104b, 104c, 104d. In some embodiments, the first semiconductor layers 104a, 104b, 104c, 104d include SiGe, and the first semiconductor layer 104a has a higher atomic percent Ge than that of the first semiconductor layers 104b, 104c, 104d. As a result, the first semiconductor layer 104a may be etched at a faster rate than the first semiconductor layers 104b, 104c, 104d. The thickness of the first semiconductor layer 104a may range from about 5 nm to about 30 nm.

The first and second semiconductor layers 104, 106 are formed by any suitable deposition process, such as epitaxy. By way of example, epitaxial growth of the layers of the stack of semiconductor layers 102 may be performed by a molecular beam epitaxy (MBE) process, a metalorganic chemical vapor deposition (MOCVD) process, and/or other suitable epitaxial growth processes.

Figure 2:
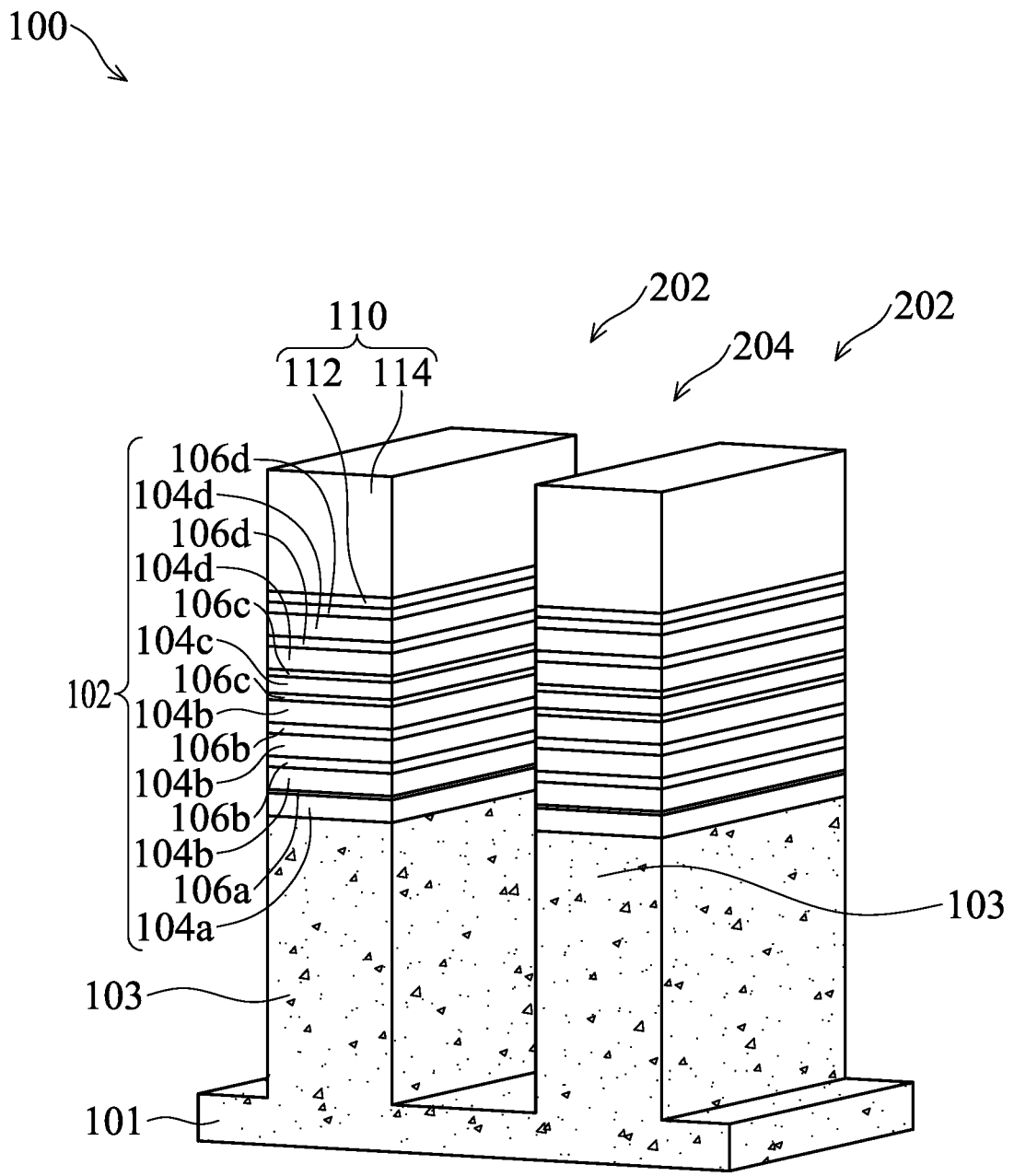

FIG. 2 is a perspective view of one of the various stages of manufacturing the semiconductor device structure 100, in accordance with some embodiments. As shown in FIG. 2, fins 202 are formed. In some embodiments, each fin 202 includes a substrate portion 103 formed from the substrate 101, a portion of the stack of semiconductor layers 102, and a portion of a mask structure 110. The mask structure 110 is formed over the stack of semiconductor layers 102 prior to forming the fins 202. The mask structure 110 may include an oxygen-containing layer 112 and a nitrogen-containing layer 114. The oxygen-containing layer 112 may be a pad oxide layer, such as a $SiO_2$ layer. The nitrogen-containing layer 114 may be a pad nitride layer, such as $Si_3N_4$. The mask structure 110 may be formed by any suitable deposition process, such as chemical vapor deposition (CVD) process.

The fins 202 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 202 by etching the stack of semiconductor layers 102 and the substrate 101. The etch process can include dry etch, wet etch, reactive ion etch (RIE), and/or other suitable processes. As shown in FIG. 2, two fins 202 are formed, but the number of the fins is not limited to two.

In some embodiments, the fins 202 may be fabricated using suitable processes including photolithography and etch processes. The photolithography process may include forming a photoresist layer (not shown) over the mask structure 110, exposing the resist to a pattern, performing post-exposure bake processes, and developing the resist to form a patterned resist. In some embodiments, patterning the resist to form the patterned resist may be performed using an electron beam (e-beam) lithography process. The patterned resist may then be used to protect regions of the substrate 101, and layers formed thereupon, while an etch process forms trenches 204 in unprotected regions through the mask structure 110, the stack of semiconductor layers 102, and into the substrate 101, thereby leaving the extending fins 202. The trenches 204 may be etched using a dry etch (e.g., RIE), a wet etch, and/or combination thereof.

As shown in FIG. 2, each fin 202 includes a plurality of second semiconductor layers 106, which includes a first group of second semiconductor layers 106b, a second group of second semiconductor layers 106c, and a third group of second semiconductor layers 106d. The second group of second semiconductor layers 106c may be disposed over the first group of second semiconductor layers 106b, and the third group of second semiconductor layers 106d may be disposed over the second group of second semiconductor layers 106c. The first, second, third groups of the second semiconductor layers 106b, 106c, 106d may be aligned along the Z direction, which may be substantially perpendicular to a major surface of the substrate 101. In some embodiments, at least two edges of the second semiconductor layers 106 are aligned along the Z direction. In some embodiments, the plurality of second semiconductor layers 106 includes a stack of second semiconductor layers 106 spaced apart from and aligned with each other.

Figure 3:
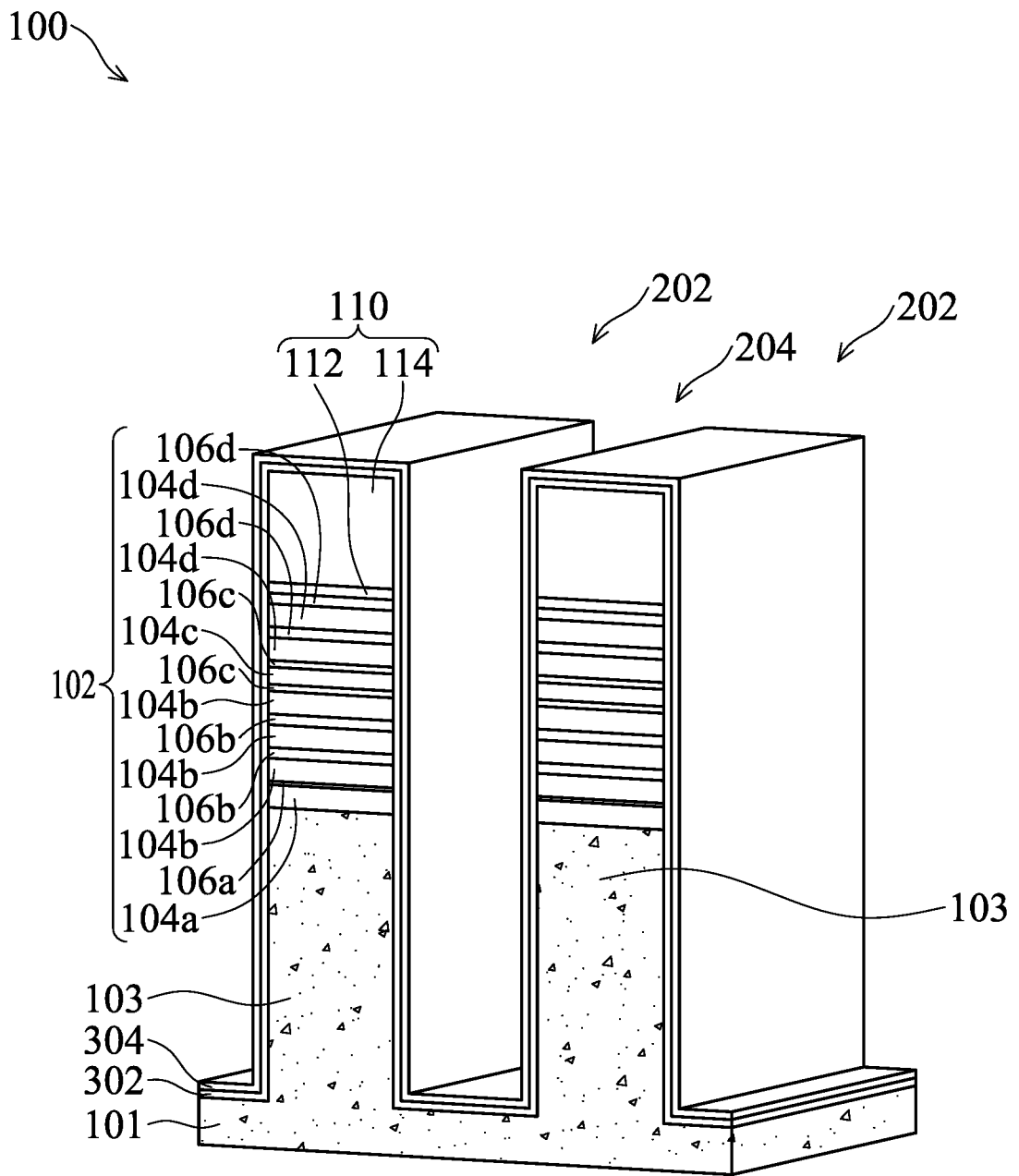

FIG. 3 is a perspective view of one of the various stages of manufacturing the semiconductor device structure 100, in accordance with some embodiments. As shown in FIG. 3, a liner 304 is formed over the substrate 101 and the fins 202. In some embodiments, an optional liner 302 may be formed on the substrate 101 and fins 202, and the liner 304 is formed on the optional liner 302. The liner 304 may be made of a semiconductor material, such as Si. In some embodiments, the liner 304 is made of the same material as the substrate 101. The optional liner 302 may be made of an oxygen-containing material, such as an oxide. The liner 304 may be a conformal layer and may be formed by a conformal process, such as an atomic layer deposition (ALD) process. The term "conformal" may be used herein for ease of description upon a layer having substantial same thickness over various regions. The optional liner 302 may be a conformal layer and may be formed by a conformal process, such as an ALD process.

Figure 4:
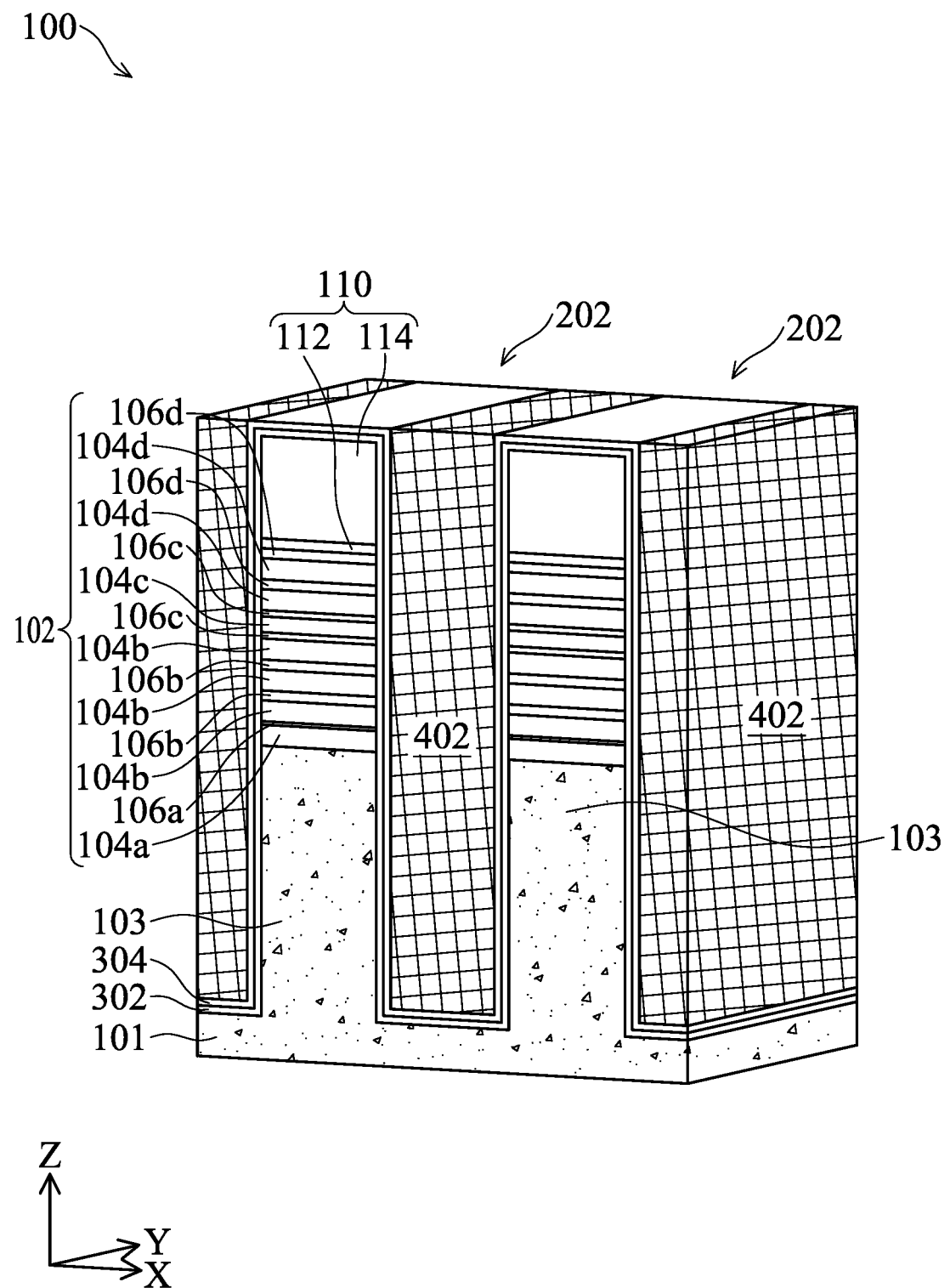

FIG. 4 is a perspective view of one of the various stages of manufacturing the semiconductor device structure 100, in accordance with some embodiments. As shown in FIG. 4, an insulating material 402 is formed on the substrate 101. The insulating material 402 fills the trench 204 (FIG. 2). The insulating material 402 may be first formed over the substrate 101 so that the fins 202 are embedded in the insulating material 402. Then, a planarization operation, such as a chemical mechanical polishing (CMP) process and/or an etch-back process, is performed such that the tops of the fins 202 (e.g., the liner 304) are exposed from the insulating material 402, as shown in FIG. 4. The insulating material 402 may be made of an oxygen-containing material, such as silicon oxide or fluorine-doped silicate glass (FSG); a nitrogen-containing material, such as silicon nitride, silicon oxynitride (SiON), SiOCN, SiCN; a low-k dielectric material; or any suitable dielectric material. The insulating material 402 may be formed by any suitable method, such as low-pressure chemical vapor deposition (LPCVD), plasma enhanced CVD (PECVD) or flowable CVD (FCVD).

Figure 5:
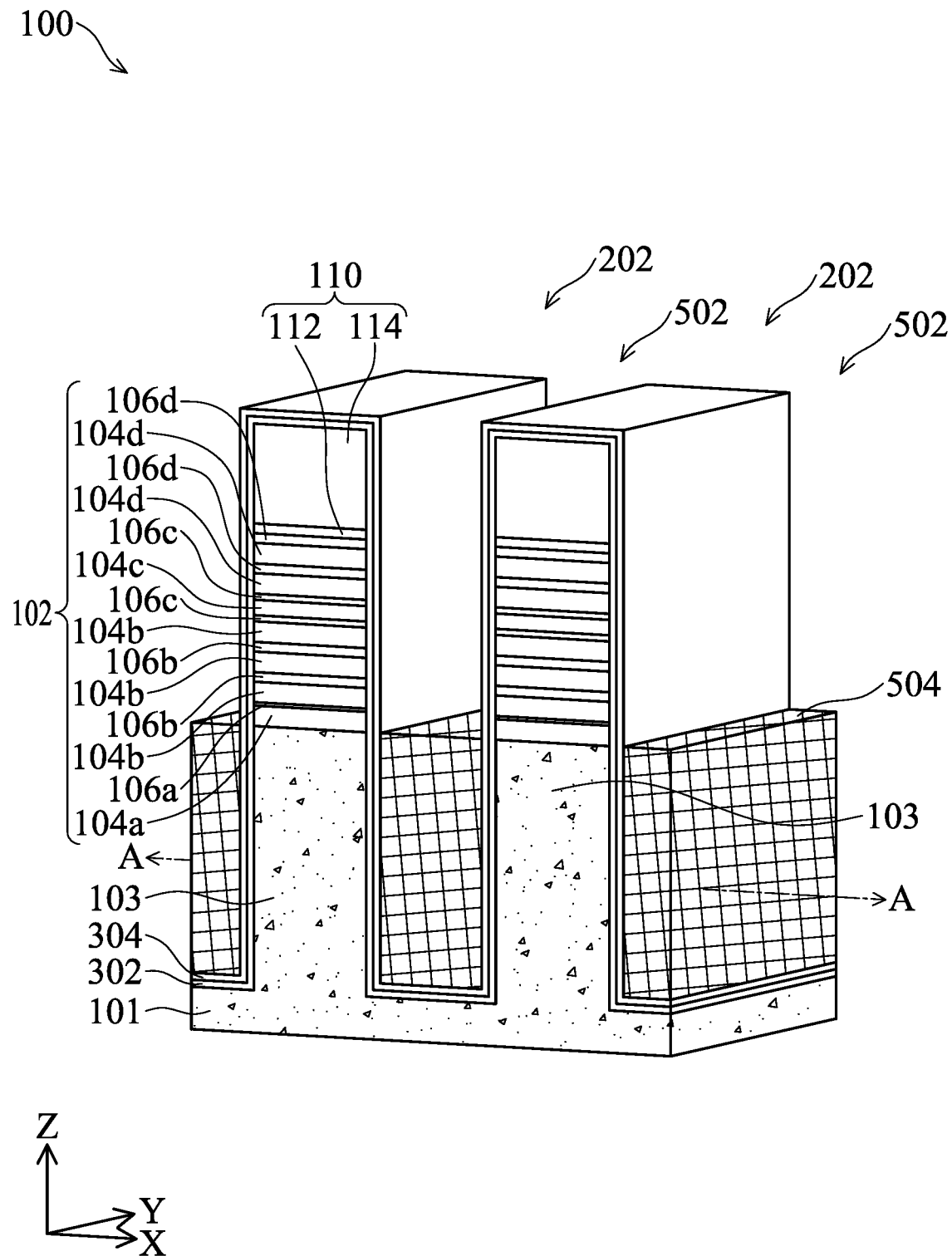

Next, as shown in FIG. 5, the insulating material 402 may be recessed by removing a portion of the insulating material 402 located between adjacent fins 202 to form trenches 502. The trenches 502 may be formed by any suitable removal process, such as dry etch or wet etch that selectively removes the insulating material 402 but not the semiconductor material of the liner 304. The recessed insulating material 402 may be the shallow trench isolation (STI). The insulating material 402 includes a top surface 504 that may be level with or below a surface of the first semiconductor layers 104a in contact with the substrate portions 103 of the substrate 101.

Figure 6:
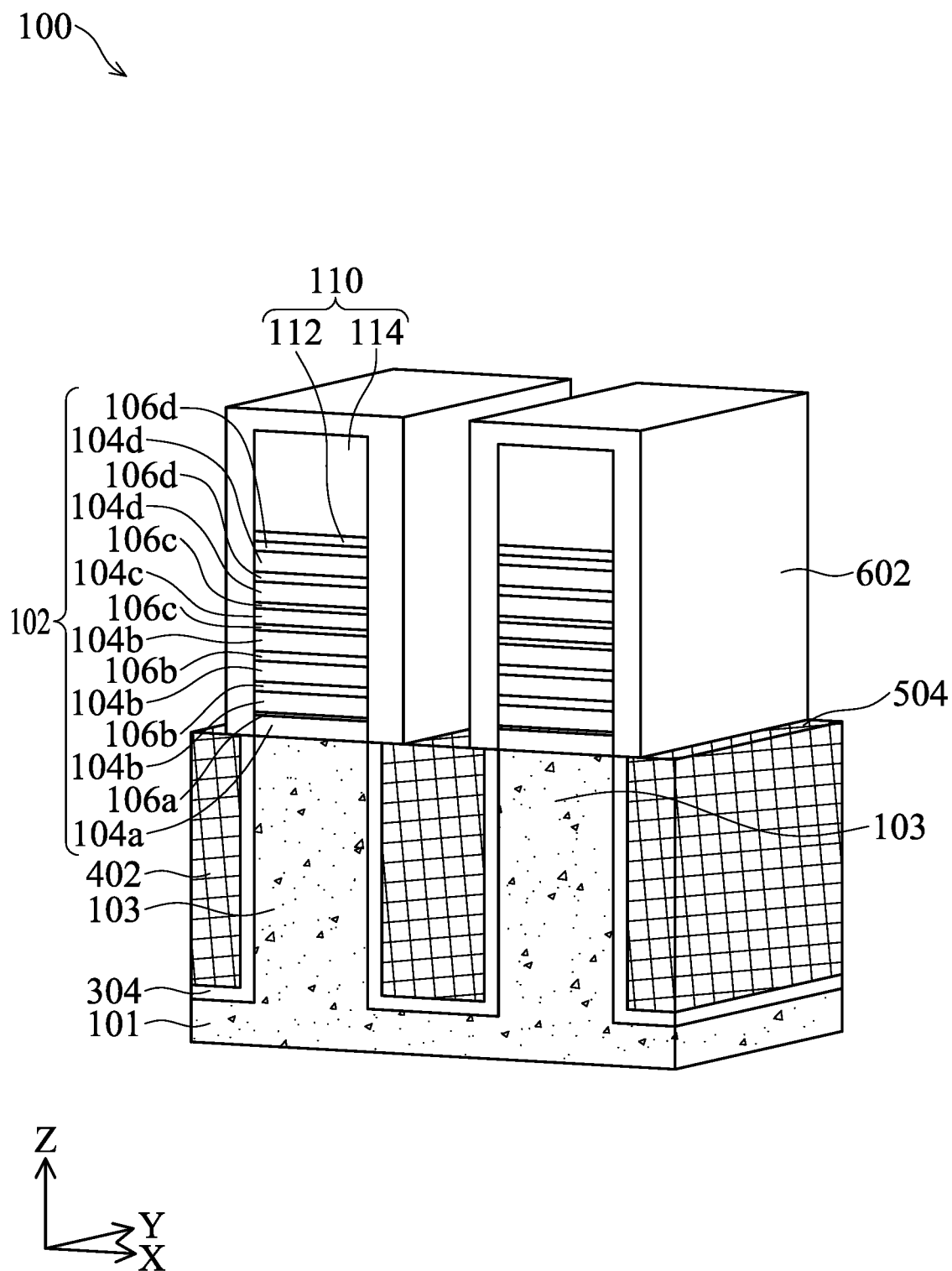

Next, as shown in FIG. 6, a cladding layer 602 is formed on the exposed surface of the liner 304 (FIG. 5), and the optional liner 302 is omitted for clarity. The liner 304 may be diffused into the cladding layer 602 during the formation of the cladding layer 602. Thus, in some embodiments where the optional liner 302 does not exist, the cladding layer 602 is in contact with the stack of semiconductor layers 102, as shown in FIG. 6. In some embodiments, the cladding layer 602 includes a semiconductor material. The cladding layer 602 grows on semiconductor materials but not on dielectric materials. For example, the cladding layer 602 includes SiGe and is grown on the Si of the liner 304 but not on the dielectric material of the insulating material 402. In some embodiments, the cladding layer 602 may be formed by first forming a semiconductor layer on the liner 304 and the insulating material 402, and followed by an etch process to remove portions of the semiconductor layer formed on the insulating material 402. The etch process may remove some of the semiconductor layer formed on the top of the fins 202, and the cladding layer 602 formed on the top of the fins 202 may have a curved profile instead of a flat profile. In some embodiments, the cladding layer 602 and the first semiconductor layers 104b, 104c, 104d include the same material having the same etch selectivity. For example, the cladding layer 602 and the first semiconductor layers 104b, 104c, 104d include SiGe. The cladding layer 602 and the first semiconductor layers 104b, 104c, 104d may be removed subsequently to create space for the gate electrode layer.

Figure 7:
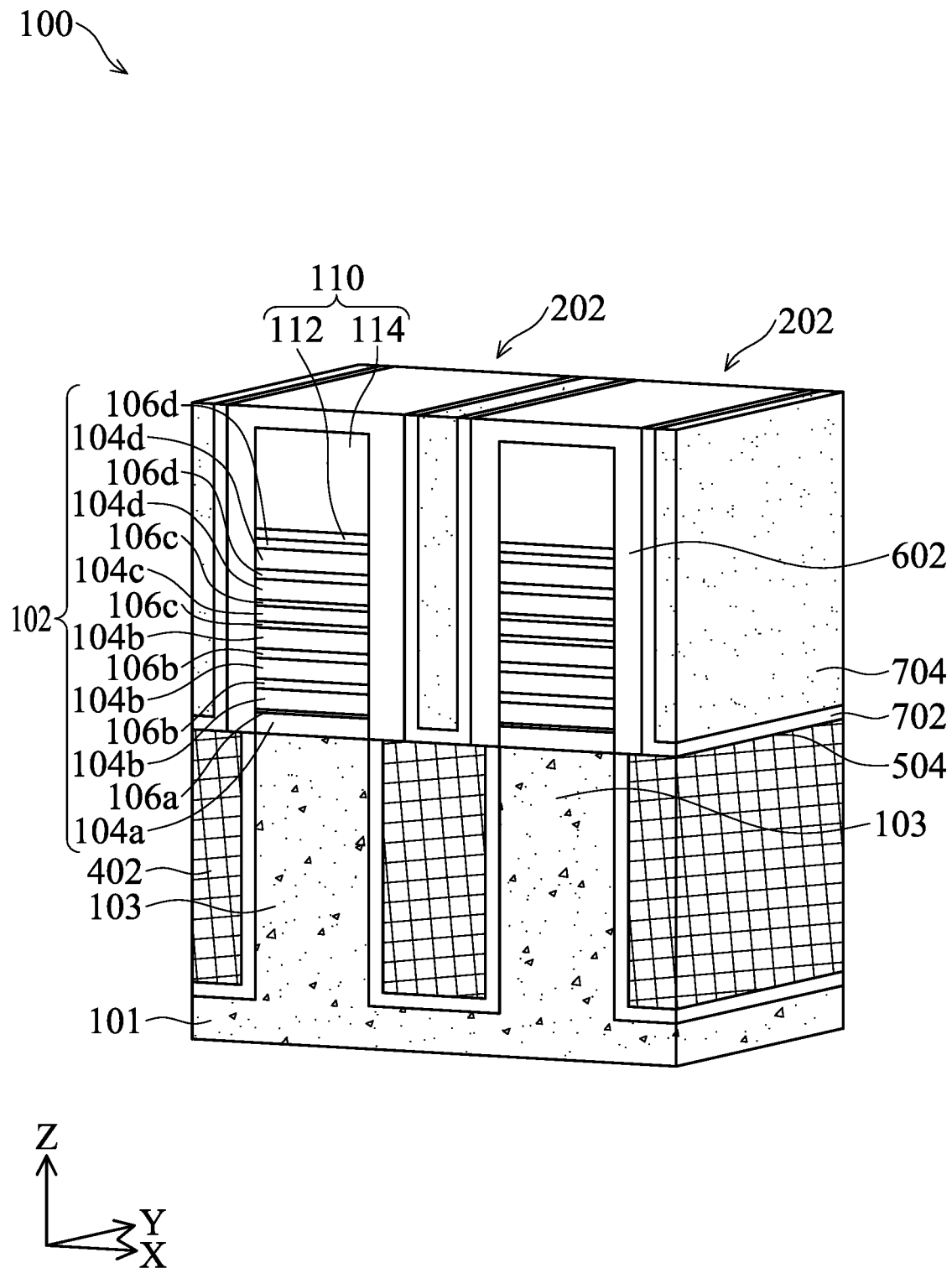

Next, as shown in FIG. 7, a liner 702 is formed on the cladding layer 602 and the top surface 504 of the insulating material 402. The liner 702 may include a low-k dielectric material (e.g., a material having a k value lower than 7), such as $SiO_2$, SiN, SiCN, SiOC, or SiOCN. The liner 702 may be formed by a conformal process, such as an ALD process. The liner 702 may have a thickness ranging from about 1 nm to about 6 nm. The liner 702 may function as a shell to protect a flowable oxide material to be formed in the trenches 502 (FIG. 5) during subsequent removal of the cladding layer 602. Thus, if the thickness of the liner 702 is less than about 1 nm, the flowable oxide material may not be sufficiently protected. On the other hand, if the thickness of the liner 702 is greater than about 6 nm, the trenches 502 (FIG. 5) may be filled.

A dielectric material 704 is formed in the trenches 502 (FIG. 5) and on the liner 702, as shown in FIG. 7. The dielectric material 704 may be an oxygen-containing material, such as an oxide, formed by FCVD. The oxygen-containing material may have a K value less than about 7, for example less than about 3. A planarization process, such as a CMP process, may be performed to remove portions of the liner 702 and the dielectric material 704 formed over the fins 202. The portion of the cladding layer 602 disposed on the nitrogen-containing layer 114 may be exposed after the planarization process.

Figure 8:
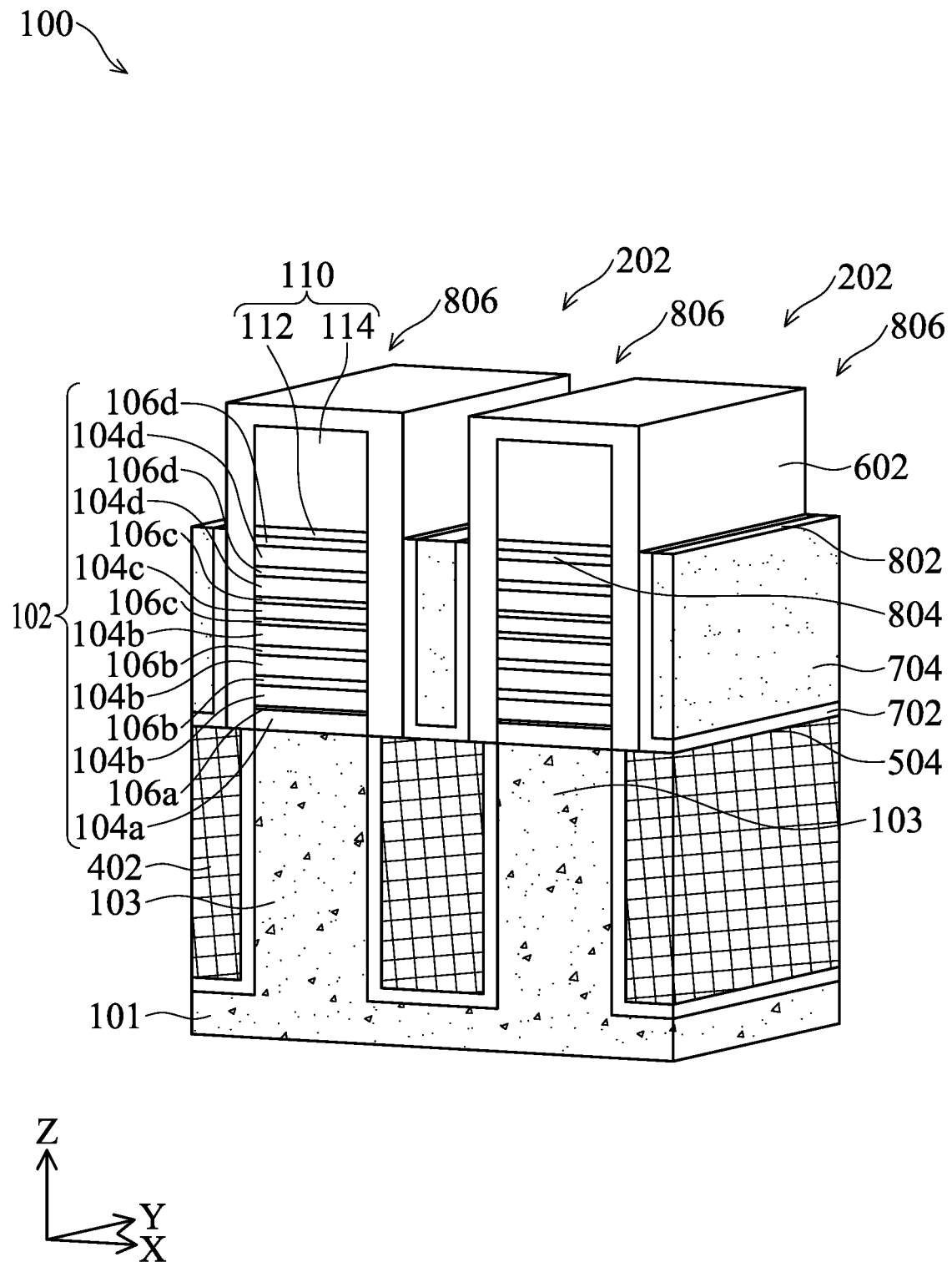

Next, as shown in FIG. 8, the liner 702 and the dielectric material 704 are recessed to the level of the topmost second semiconductor layer 106d. For example, in some embodiments, after the recess process, the dielectric material 704 may include a top surface 802 that is substantially level with a top surface 804 of the topmost second semiconductor layer 106d. The top surface 804 of the topmost second semiconductor layer 106d may be in contact with the mask structure 110, such as in contact with the oxygen-containing layer 112. The liner 702 may be recessed to the same level as the dielectric material 704. The recess of the liners 702 and the dielectric material 704 may be performed by any suitable process, such as dry etch, wet etch, or a combination thereof. In some embodiments, a first etch process may be performed to recess the dielectric material 704, followed by a second etch process to recess the liner 702. The etch processes may be selective etch processes that do not remove the semiconductor material of the cladding layer 602. As a result of the recess process, trenches 806 are formed between the fins 202.

Figure 9:
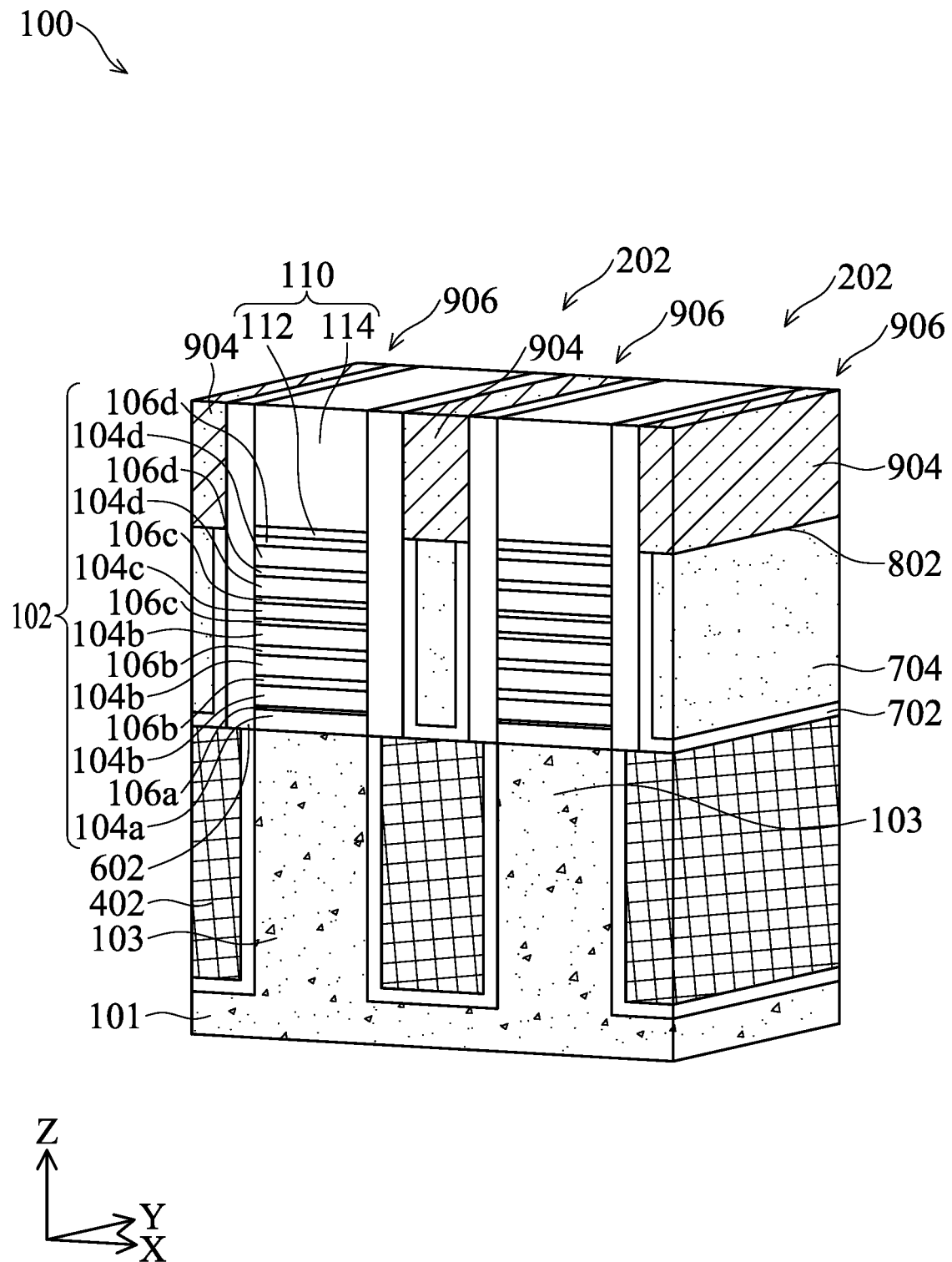

A dielectric material 904 is formed in the trenches 806 (FIG. 8) and on the dielectric material 704, the liner 702, as shown in FIG. 9. The dielectric material 904 may include SiO, SiN, SiC, SiCN, SiON, SiOCN, AlO, AlN, AlON, ZrO, ZrN, ZrAlO, HfO, or other suitable dielectric material. In some embodiments, the dielectric material 904 includes a high-k dielectric material (e.g., a material having a k value greater than 7). The dielectric material 904 may be formed by any suitable process, such as a CVD, PECVD, FCVD, or ALD process. A planarization process is performed to expose the nitrogen-containing layer 114 of the mask structure 110, as shown in FIG. 9. The planarization process may be any suitable process, such as a CMP process. The planarization process removes portions of the dielectric material 904 and the cladding layer 602 disposed over the mask structure 110. The liner 702, the dielectric material 704, and the dielectric material 904 together may be referred to as a dielectric feature 906. The dielectric feature 906 may be a dielectric fin that separates adjacent source/drain (S/D) epitaxial features and adjacent gate electrode layers.

Figure 10:
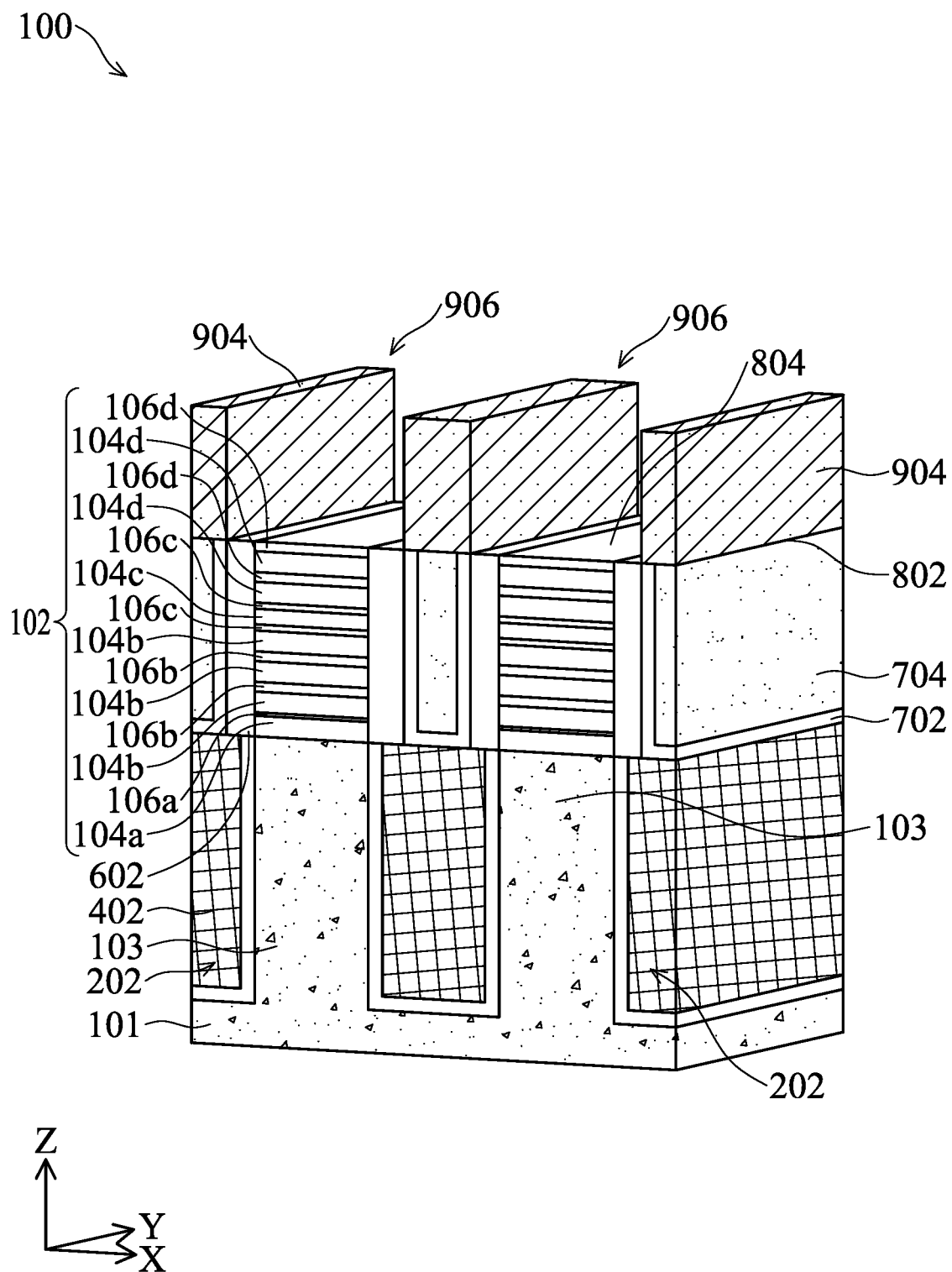

Next, as shown in FIG. 10, the cladding layers 602 are recessed, and the mask structures 110 are removed. The recess of the cladding layers 602 may be performed by any suitable process, such as dry etch, wet etch, or a combination thereof. The recess process may be controlled so that the remaining cladding layers 602 are substantially at the same level as the top surface 804 of the topmost second semiconductor layer 106d in the stack of semiconductor layers 102. The etch process may be a selective etch process that does not remove the dielectric material 904. The removal of the mask structures 110 may be performed by any suitable process, such as dry etch, wet etch, or a combination thereof. The removal of the mask structure 110 exposes the top surfaces 804 of the topmost second semiconductor layers 106d in the stacks of semiconductor layers 102.

Figure 11:
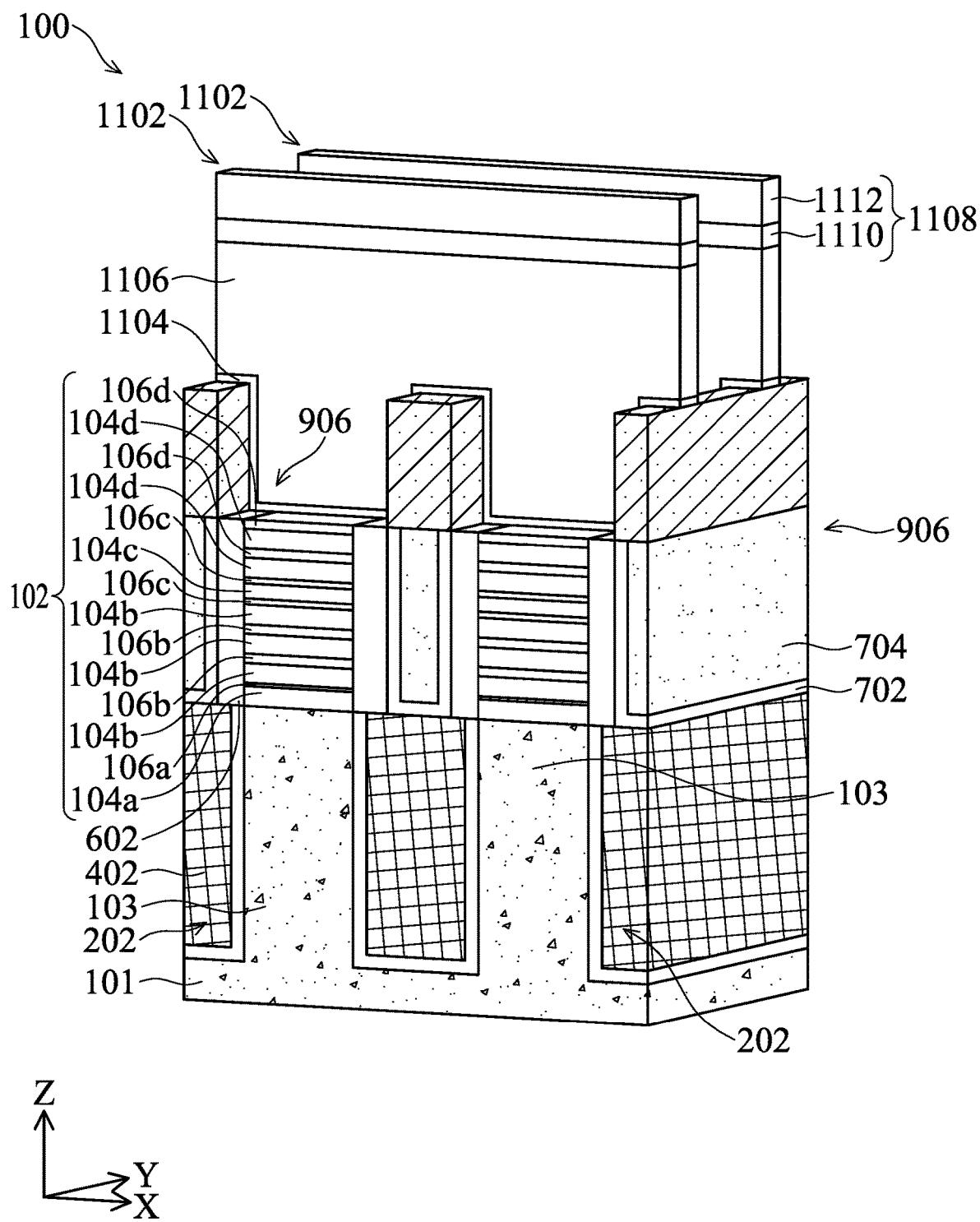

Next, as shown in FIG. 11, one or more sacrificial gate stacks 1102 are formed on the semiconductor device structure 100. The sacrificial gate stack 1102 may include a sacrificial gate dielectric layer 1104, a sacrificial gate electrode layer 1106, and a mask structure 1108. The sacrificial gate dielectric layer 1104 may include one or more layers of dielectric material, such as $SiO_2$, SiN, a high-k dielectric material, and/or other suitable dielectric material. In some embodiments, the sacrificial gate dielectric layer 1104 includes a material different than that of the dielectric material 904. In some embodiments, the sacrificial gate dielectric layer 1104 may be deposited by a CVD process, a sub-atmospheric CVD (SACVD) process, a FCVD process, an ALD process, a PVD process, or other suitable process. The sacrificial gate electrode layer 1106 may include polycrystalline silicon (polysilicon). The mask structure 1108 may include an oxygen-containing layer 1110 and a nitrogen-containing layer 1112. In some embodiments, the sacrificial gate electrode layer 1106 and the mask structure 1108 are formed by various processes such as layer deposition, for example, CVD (including both LPCVD and PECVD), PVD, ALD, thermal oxidation, e-beam evaporation, or other suitable deposition techniques, or combinations thereof.

Figure 13:
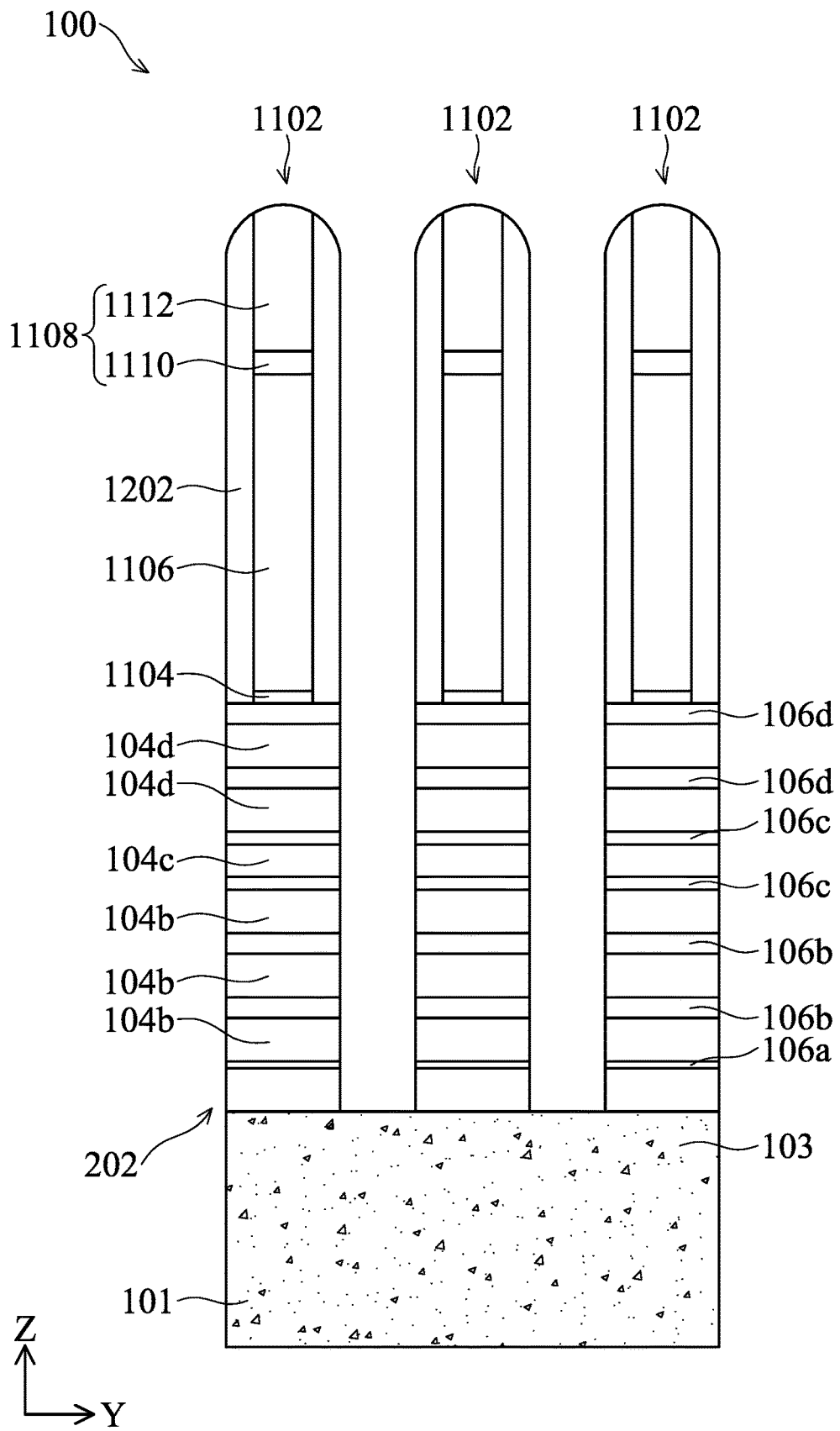
FIG. 13 is a cross-sectional side view of the stage of manufacturing the semiconductor device structure taken along line A-A of FIG. 12, in accordance with some embodiments.

The sacrificial gate stacks 1102 may be formed by first depositing blanket layers of the sacrificial gate dielectric layer 1104, the sacrificial gate electrode layer 1106, and the mask structure 1108, followed by pattern and etch processes. For example, the pattern process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etch process may include dry etch (e.g., RIE), wet etch, other etch methods, and/or combinations thereof. By patterning the sacrificial gate stack 1102, the stacks of semiconductor layers 102 of the fins 202 are partially exposed on opposite sides of the sacrificial gate stack 1102. As shown in FIG. 11, two sacrificial gate stacks 1102 are formed, but the number of the sacrificial gate stacks 1102 is not limited to two. More than two sacrificial gate stacks 1102 are arranged along the Y direction in some embodiments. Three or more sacrificial gate stacks 1102 are arranged along the Y direction in some embodiments, as shown in FIG. 13.

Figure 12:
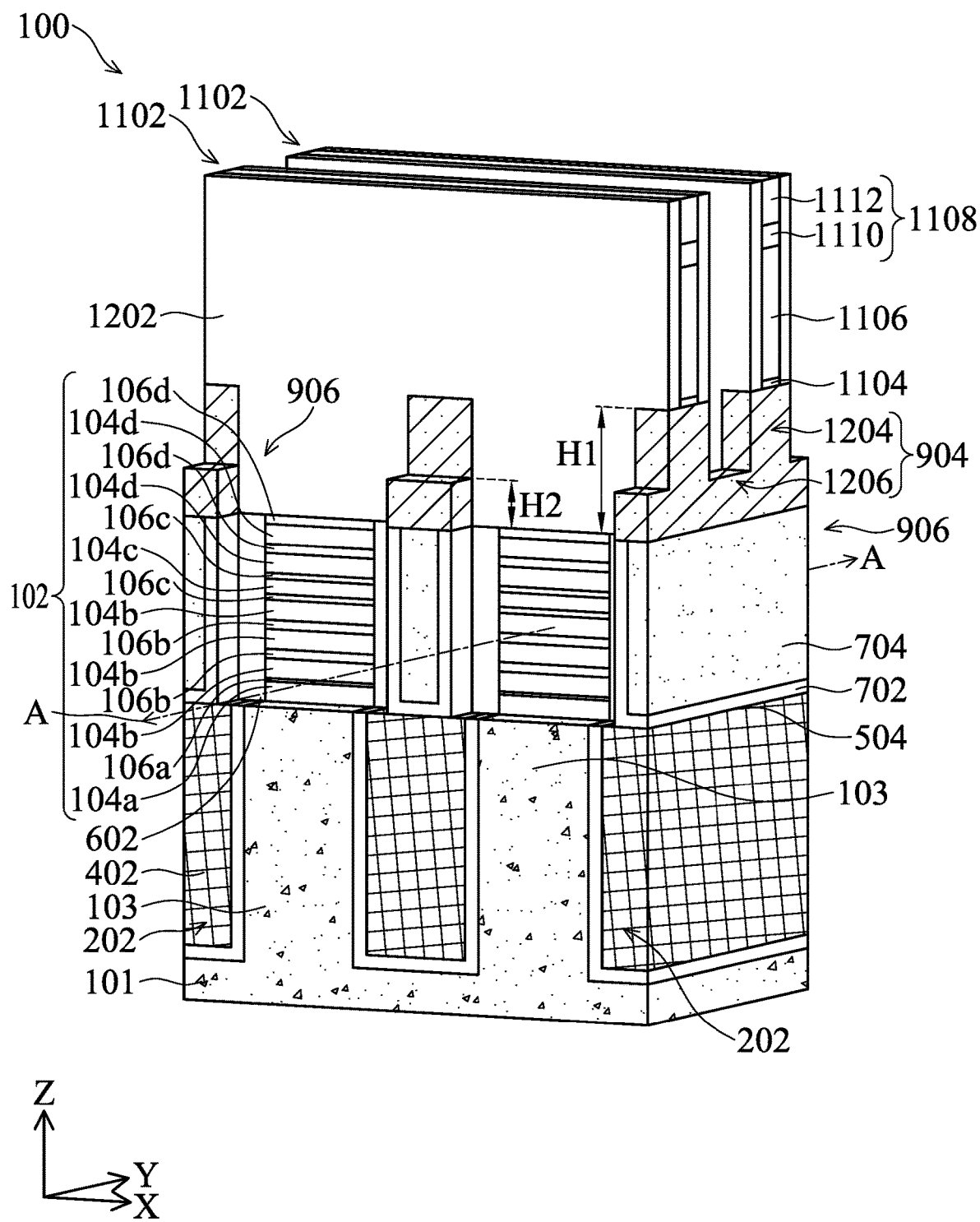

As shown in FIG. 12, a spacer 1202 is formed on the sidewalls of the sacrificial gate stacks 1102. The spacer 1202 may be formed by first depositing a conformal layer that is subsequently etched back to form sidewall spacers 1202. For example, a spacer material layer can be disposed conformally on the exposed surfaces of the semiconductor device structure 100. The conformal spacer material layer may be formed by an ALD process. Subsequently, anisotropic etch is performed on the spacer material layer using, for example, RIE. During the anisotropic etch process, most of the spacer material layer is removed from horizontal surfaces, such as the tops of the fins 202, the cladding layer 602, and the dielectric material 904, leaving the spacers 1202 on the vertical surfaces, such as the sidewalls of sacrificial gate stack 1102. The spacer 1202 may be made of a dielectric material such as silicon oxide, silicon nitride, silicon carbide, silicon oxynitride, SiCN, silicon oxycarbide, SiOCN, and/or combinations thereof. In some embodiments, the spacer 1202 includes multiple layers, such as main spacer walls, liner layers, and the like.

Next, exposed portions of the fins 202, exposed portions of the cladding layers 602, and exposed portions of the dielectric material 904 not covered by the sacrificial gate stacks 1102 and the spacers 1202 are selectively recessed by using one or more suitable etch processes, such as dry etch, wet etch, or a combination thereof. In some embodiments, exposed portions of the stacks of semiconductor layers 102 of the fins 202 are removed, exposing portions of the substrate portions 103. As shown in FIG. 12, the exposed portions of the fins 202 are recessed to a level at or below the top surface 504 of the insulating material 402. The recess processes may include an etch process that recesses the exposed portions of the fins 202 and the exposed portions of the cladding layers 602.

In some embodiments, the etch process may reduce the height of the exposed dielectric material 904 of the dielectric feature 906 from H1 to H2, as shown in FIG. 12. Thus, a first portion 1204 of the dielectric material 904 under the sacrificial gate stack 1102 and the spacers 1202 has the height H1, while a second portion 1206 of the dielectric material 904 located between S/D epitaxial features 1602 (FIG. 17) has the height H2 less than the height H1.

FIG. 13 is a cross-sectional side view of the stage of manufacturing the semiconductor device structure 100 taken along line A-A of FIG. 12, in accordance with some embodiments. As shown in FIG. 13, three sacrificial gate stacks 1102 are disposed on the fin 202, and portions of the stack of semiconductor layers 102 not covered by the sacrificial gate stacks 1102 are removed to expose the substrate portions 103. At this stage, end portions of the stacks of semiconductor layers 102 under the sacrificial gate stacks 1102 and the spacers 1202 have substantially flat surfaces which may be flush with corresponding spacers 1202. In some embodiments, the end portions of the stacks of semiconductor layers 102 under the sacrificial gate stacks 1102 and spacers 1202 are slightly horizontally etched.

Figure 14:
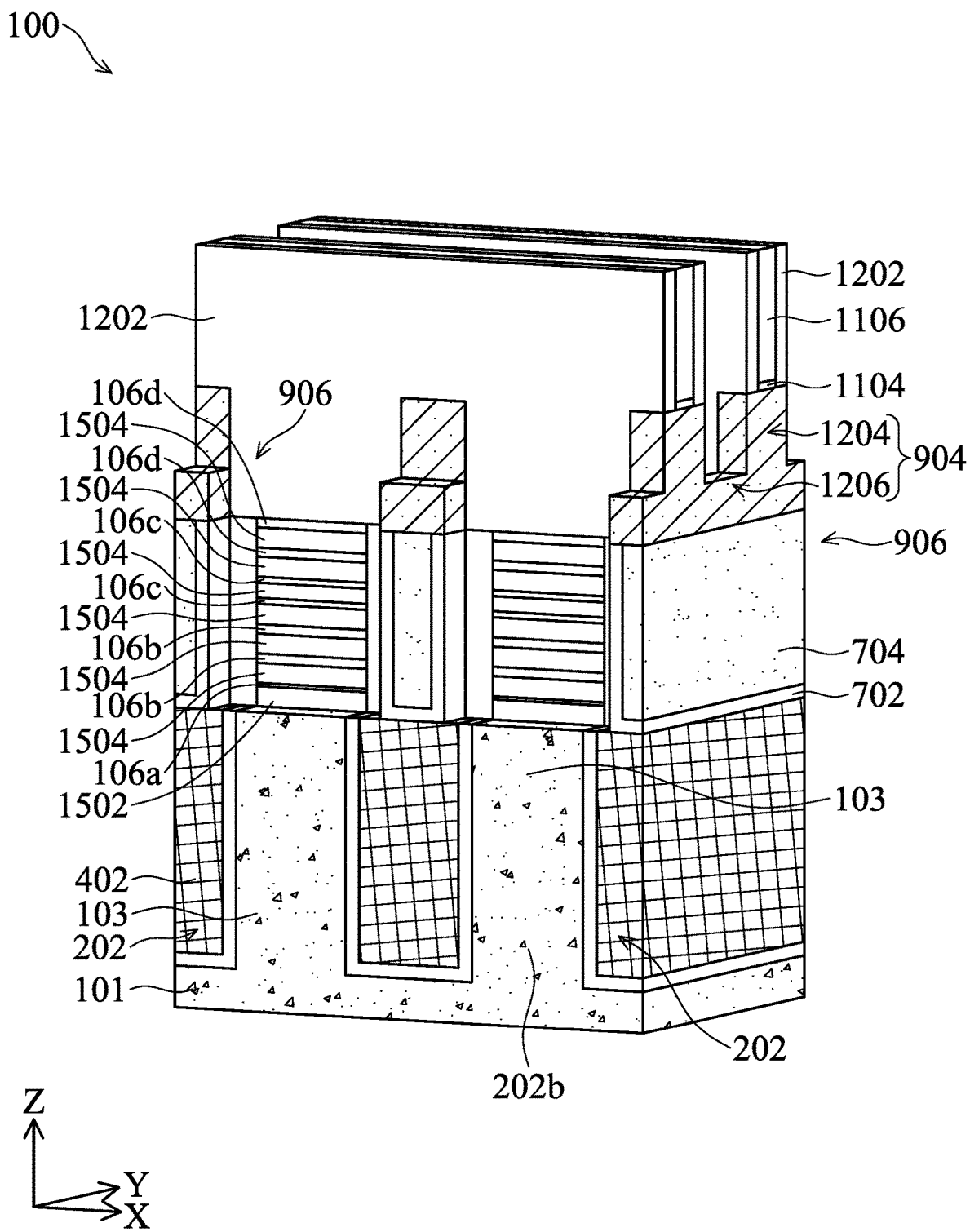
FIG. 14 is a perspective view of a stage of manufacturing the semiconductor device structure, in accordance with some embodiments.
Figure 15:
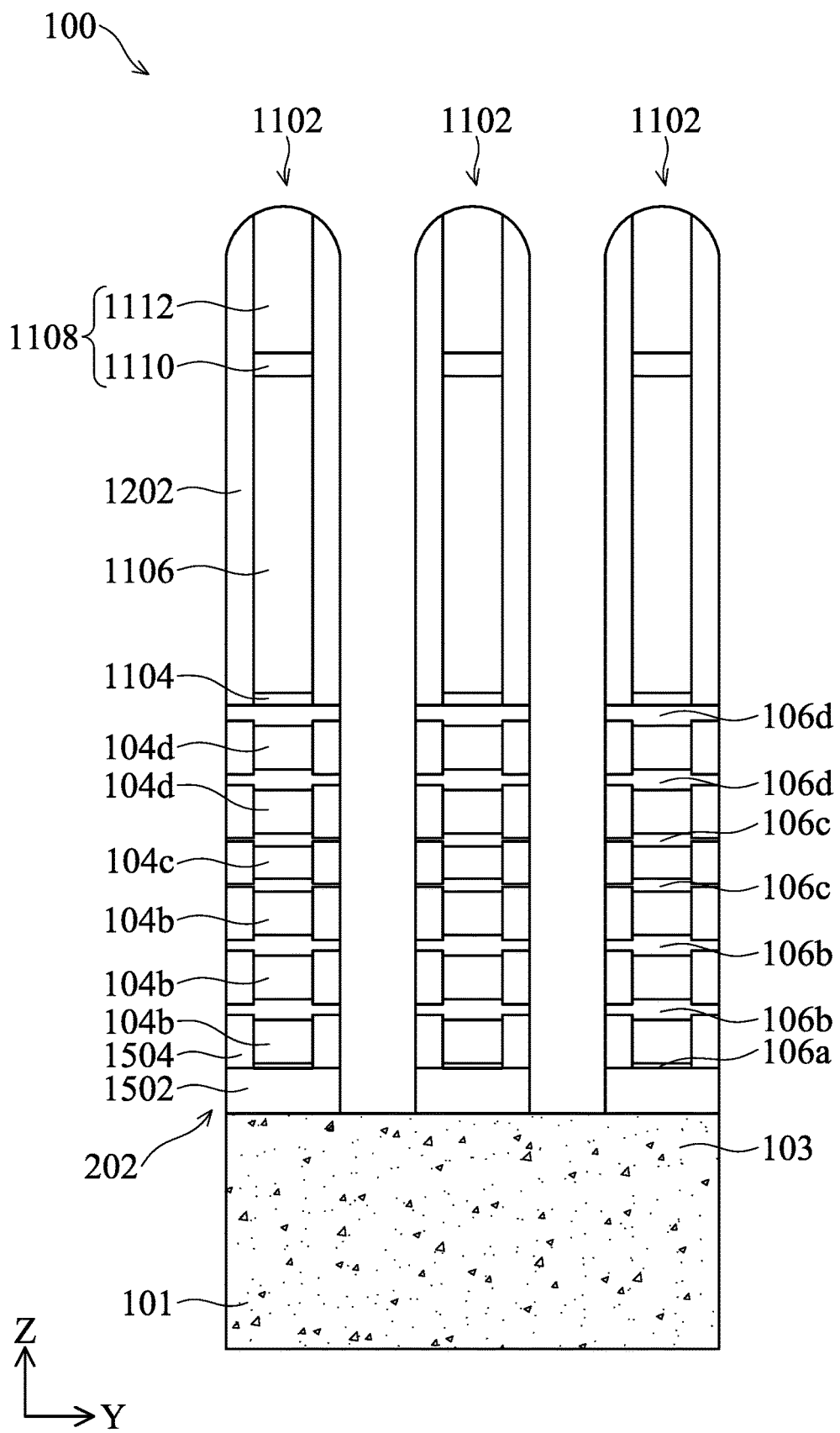
FIG. 15 is a cross-sectional side view of the stage of manufacturing the semiconductor device structure of FIG. 14 taken along line A-A of FIG. 12, in accordance with some embodiments.

FIG. 14 is a perspective view of a stage of manufacturing the semiconductor device structure, in accordance with some embodiments. FIG. 15 is a cross-sectional side view of the stage of manufacturing the semiconductor device structure of FIG. 14 taken along line A-A of FIG. 12, in accordance with some embodiments. After recessing the exposed materials not covered by the sacrificial gate stacks 1102, the first semiconductor layer 104a, the edge portions of each first semiconductor layer 104b, 104c, 104d, and edge portions of the cladding layers 602 are removed. In some embodiments, the removal is a selective wet etch process. For example, in cases where the first semiconductor layers 104b, 104c, 104d are made of SiGe having a first atomic percent germanium, the first semiconductor layer 104a is made of SiGe having a second atomic percent germanium greater than the first atomic percent germanium, the cladding layers 602 are made of the same material as the first semiconductor layers 104b, 104c, 104d, and the second semiconductor layers 106a, 106b, 106c, 106d are made of silicon, a selective wet etch using an ammonia and hydrogen peroxide mixtures (APM) may be used. With the APM etch, the first semiconductor layer 104a is etched at a first etch rate, the first semiconductor layers 104b, 104c, 104d and the cladding layers 602 are etched at a second etch rate slower than the first etch rate due to different atomic percentages of germanium in the layers, and the second semiconductor layers 106a, 106b, 106c, 106d are etched at a third etch rate slower than the second etch rate. As a result, the first semiconductor layer 104a may be completely removed, while edge portions of the first semiconductor layers 104b, 104c, 104d and edge portions of the cladding layers 602 may be removed, and the second semiconductor layers 106a, 106b, 106c, 106d are substantially unchanged. In some embodiments, the selective removal process may include SiGe oxidation followed by a SiGeOx removal.

Next, as show in FIGS. 14 and 15, a dielectric layer 1502 is formed in the space created by the removal of the first semiconductor layer 104a, and dielectric spacers 1504 are formed in the space created by the removal of the edge portions of the first semiconductor layers 104b, 104c, 104d and the edge portions of the cladding layers 602. In other words, the first semiconductor layer 104a is replaced with the dielectric layer 1502. In some embodiments, the dielectric spacers 1504 may be flush with the spacers 1202. In some embodiments, small amount of each second semiconductor layers 106 may be removed during the removal of the first semiconductor layer 104a, the edge portions of each first semiconductor layer 104b, 104c, 104d, and edge portions of the cladding layers 602, and the dielectric spacers 1504 disposed on opposite sides of the first semiconductor layers 104 may be thicker than the corresponding first semiconductor layer 104, as shown in FIG. 15. In some embodiments, edge portions of the second semiconductor layer 106a are removed, and the sides of the second semiconductor layer 106a are in contact with the dielectric spacers 1504.

In some embodiments, the dielectric layer 1502 may include a low-k dielectric material, such as SiO2, SiN, SiCN, SiOC, or SiOCN, or a high-k dielectric material, such as HfO2, ZrOx, ZrAlOx, HfAlOx, HfSiOx, AlOx, or other suitable dielectric material. In some embodiments, the dielectric layer 1502 may include TiO, TaO, LaO, YO, TaCN, or ZrN. The dielectric spacers 1504 may be include a low-k dielectric material, such as SiON, SiCN, SiOC, SiOCN, or SiN. In some embodiments, the dielectric layer 1502 and the dielectric spacers 1504 include the same dielectric material. For example, the dielectric layer 1502 and the dielectric spacers 1504 may be formed by first forming a conformal dielectric layer using a conformal deposition process, such as ALD, followed by an anisotropic etching to remove portions of the conformal dielectric layer other than the dielectric layer 1502 and the dielectric spacers 1504. The dielectric layer 1502 and the dielectric spacers 1504 may be protected by the second semiconductor layers 106a, 106b, 106c, 106d during the anisotropic etching process. The dielectric layer 1502 may have a thickness ranging from about 5 nm to about 30 nm. The dielectric layer 1502 serves to protect the channel regions during the subsequent removal of the substrate 101. Thus, if the thickness of the dielectric layer 1502 is less than about 5 nm, the dielectric layer 1502 may not be sufficient to protect the channel regions. On the other hand, if the thickness of the dielectric layer 1502 is greater than about 30 nm, the manufacturing cost is increased without significant advantage.

Figure 16A:
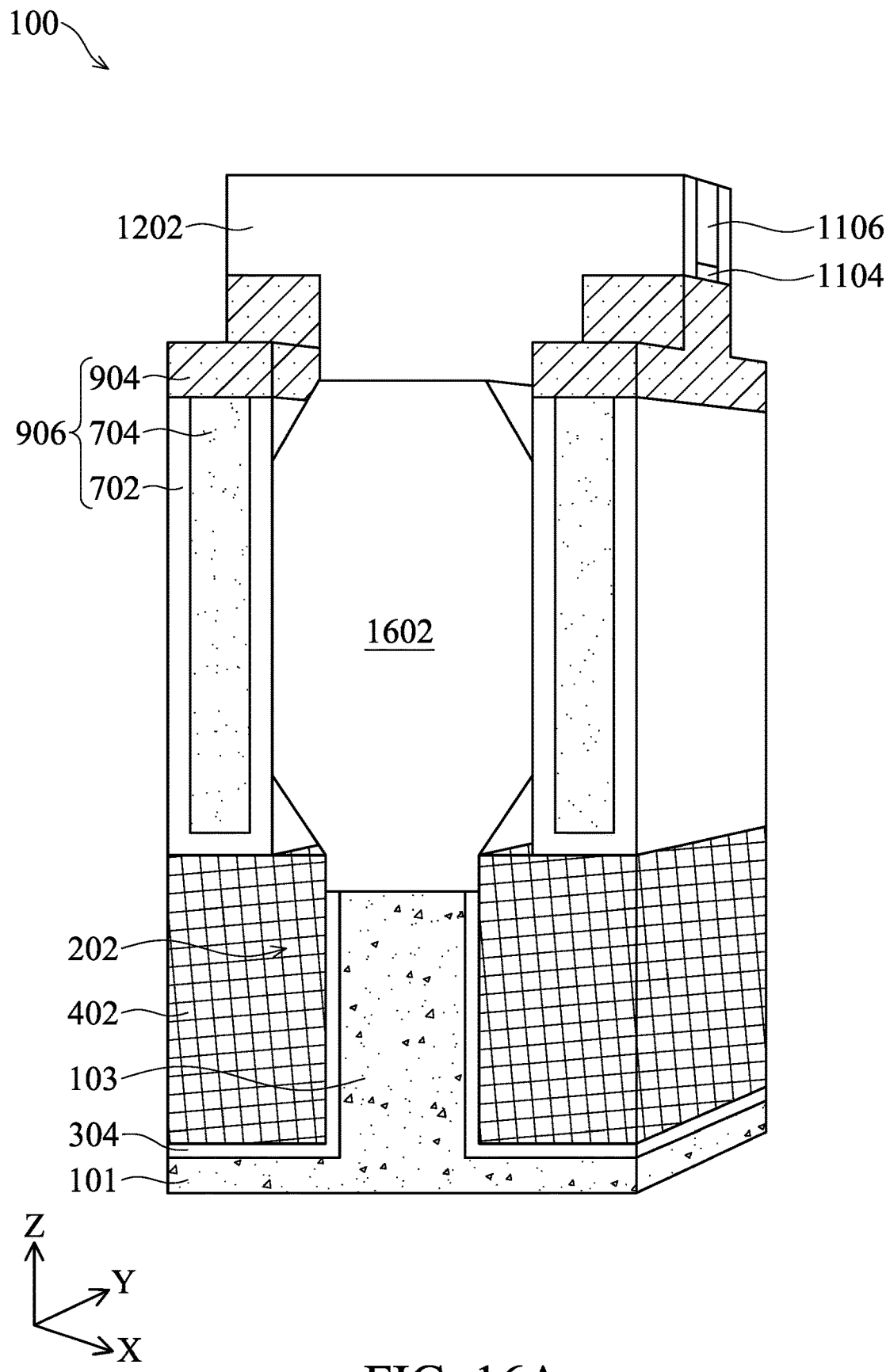
FIG. 16A is a perspective view of a stage of manufacturing the semiconductor device structure, in accordance with some embodiments.
Figure 16B:
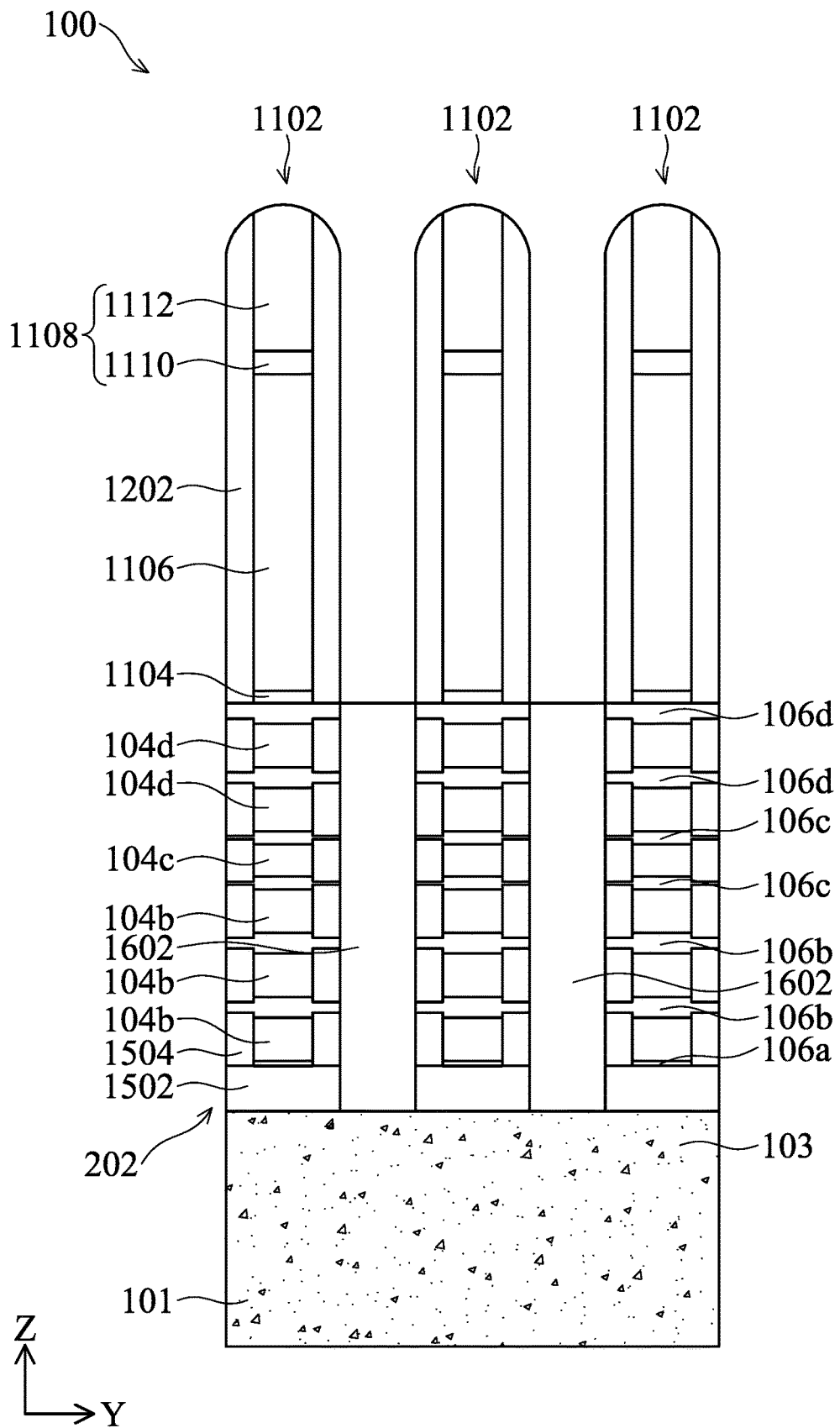
FIG. 16B is a cross-sectional side view of the stage of manufacturing the semiconductor device structure of FIG. 16A taken along line A-A of FIG. 12, in accordance with some embodiments.

Next, as shown in FIGS. 16A and 16B, S/D epitaxial features 1602 are formed on the substrate portions 103 of the fins 202. The S/D epitaxial feature 1602 may include one or more layers of Si, SiP, SiC and SiCP for an NFET or Si, SiGe, Ge for a PFET. In some embodiments, the S/D epitaxial features 1602 includes one or more layers of Si, SiGe, and Ge for a PFET. The S/D epitaxial features 1602 may grow both vertically and horizontally to form facets, which may correspond to crystalline planes of the material used for the substrate portions 103. The S/D epitaxial features 1602 may be formed by an epitaxial growth method using CVD, ALD or MBE. The S/D epitaxial features 1602 are in contact with the second semiconductor layers 106b, 106c, 106d and dielectric spacers 1504, as shown in FIG. 17. The S/D epitaxial features 1602 may be the S/D regions. In this disclosure, a source region and a drain region are interchangeably used, and the structures thereof are substantially the same.

Figure 17A:
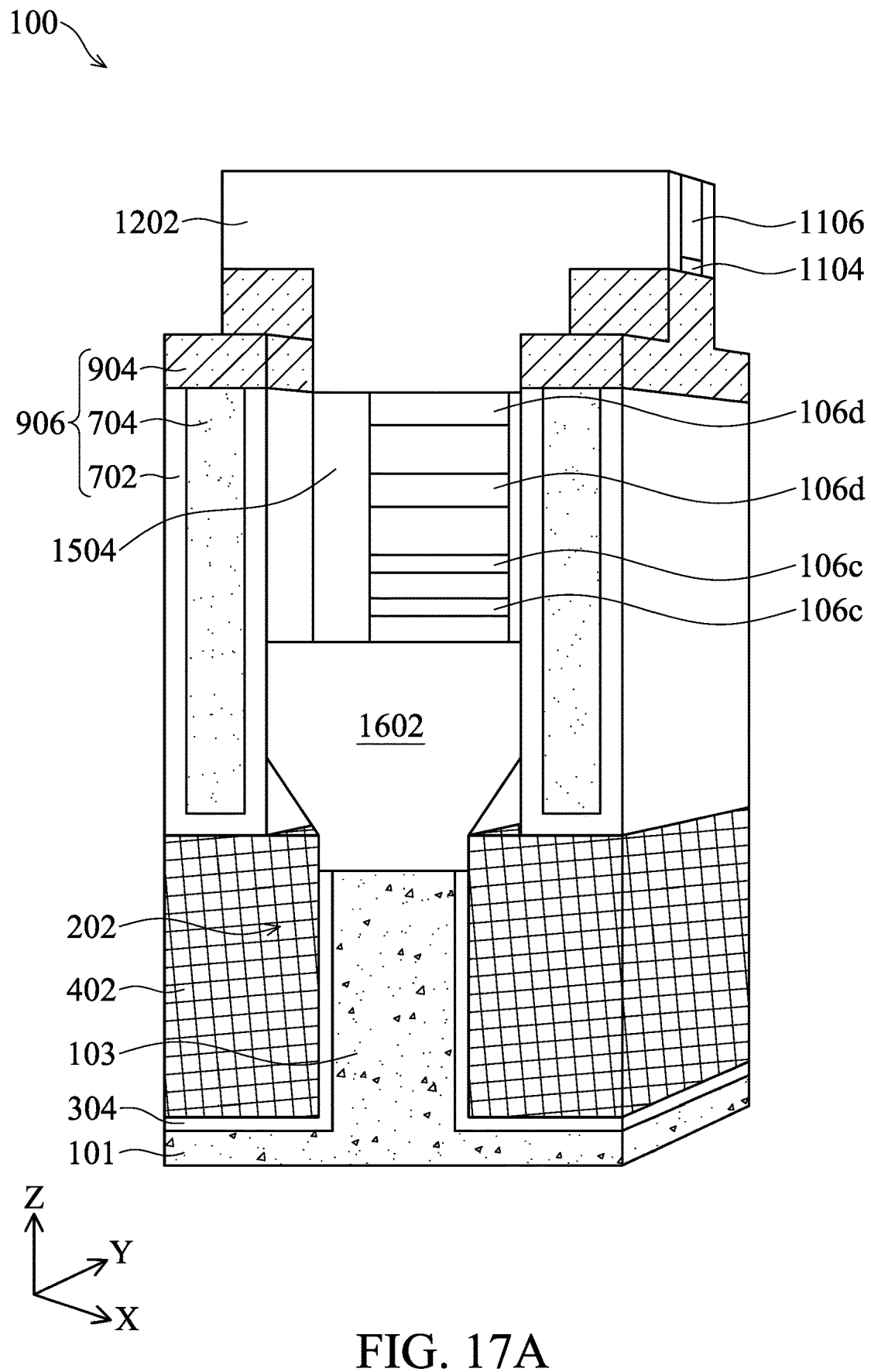
FIG. 17A is a perspective view of a stage of manufacturing the semiconductor device structure, in accordance with some embodiments.
Figure 17B:
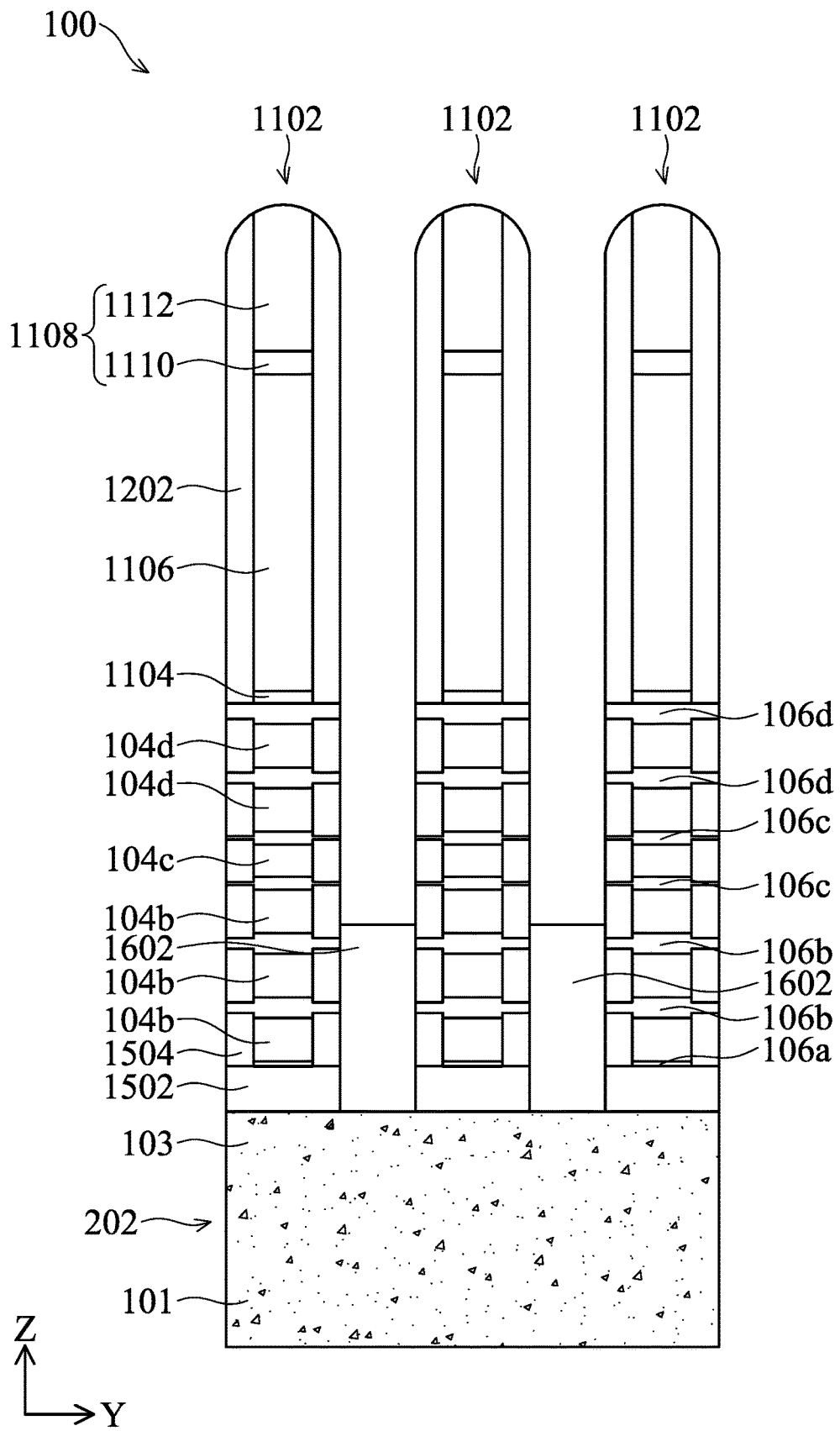
FIG. 17B is a cross-sectional side view of the stage of manufacturing the semiconductor device structure of FIG. 17A taken along line A-A of FIG. 12, in accordance with some embodiments.

Next, as shown in FIGS. 17A and 17B, the S/D epitaxial features 1602 are recessed by removing a portion of each S/D epitaxial feature 1602. The recess of the S/D epitaxial features 1602 may be performed by any suitable process, such as dry etch or wet etch that selectively removes a portion of each S/D epitaxial feature 1602 but not the dielectric materials of the nitrogen-containing layer 1112, the spacer 1202, the liner 702, and the dielectric material 904. As shown in FIG. 17B, the S/D epitaxial features 1602 are in contact with the second semiconductor layers 106b. In some embodiments, the semiconductor device structure 100 includes a nanosheet PFET having a source epitaxial feature 1602 and a drain epitaxial feature 1602 both in contact with one or more second semiconductor layers 106b, or one or more channels. In some embodiments, the nanosheet PFET includes two second semiconductor layers 106b, as shown in FIG. 17B.

Figure 18:
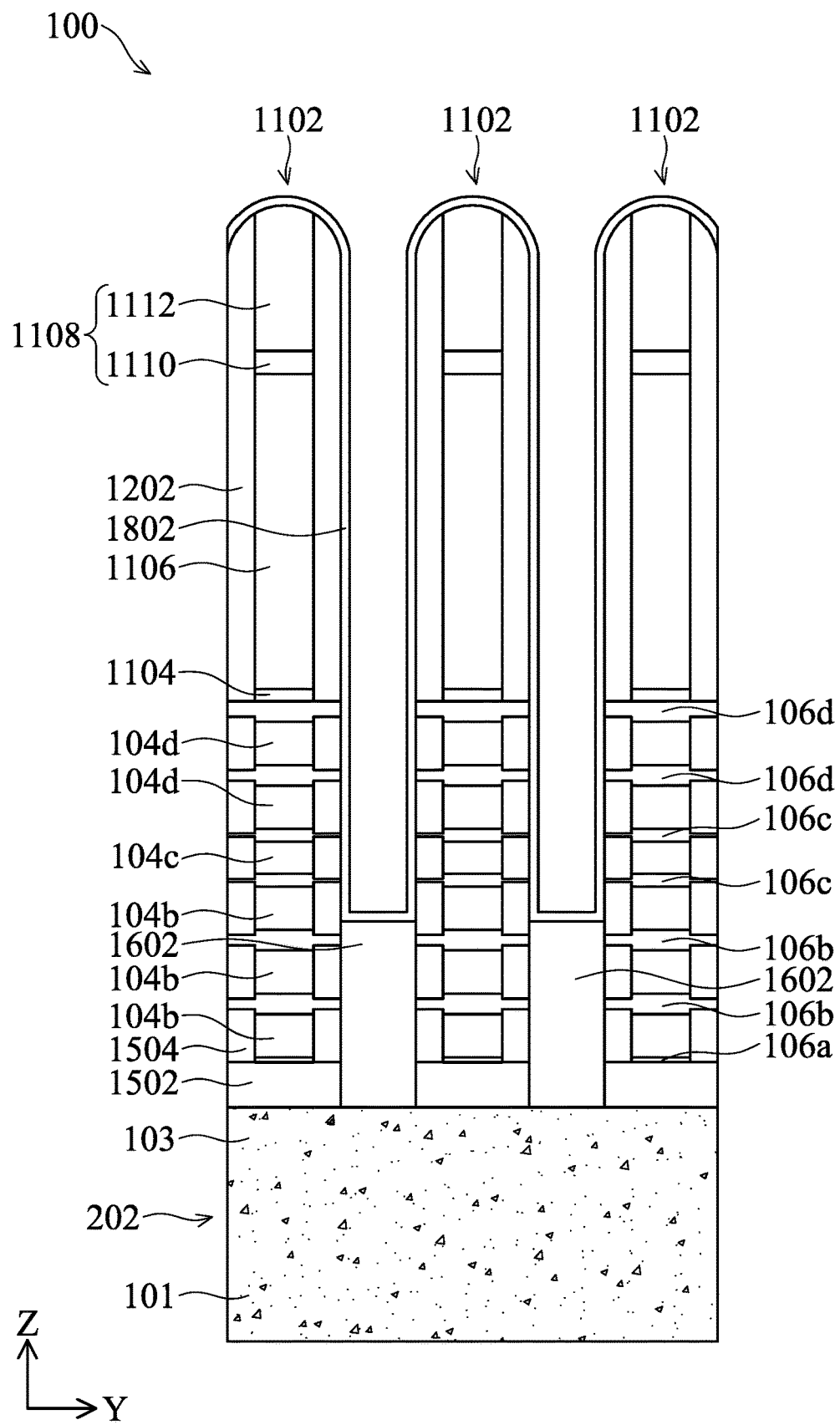
FIGS. 18-19 are cross-sectional side views of various stages of manufacturing the semiconductor device structure at different locations on the substrate, in accordance with some embodiments.
Figure 19:
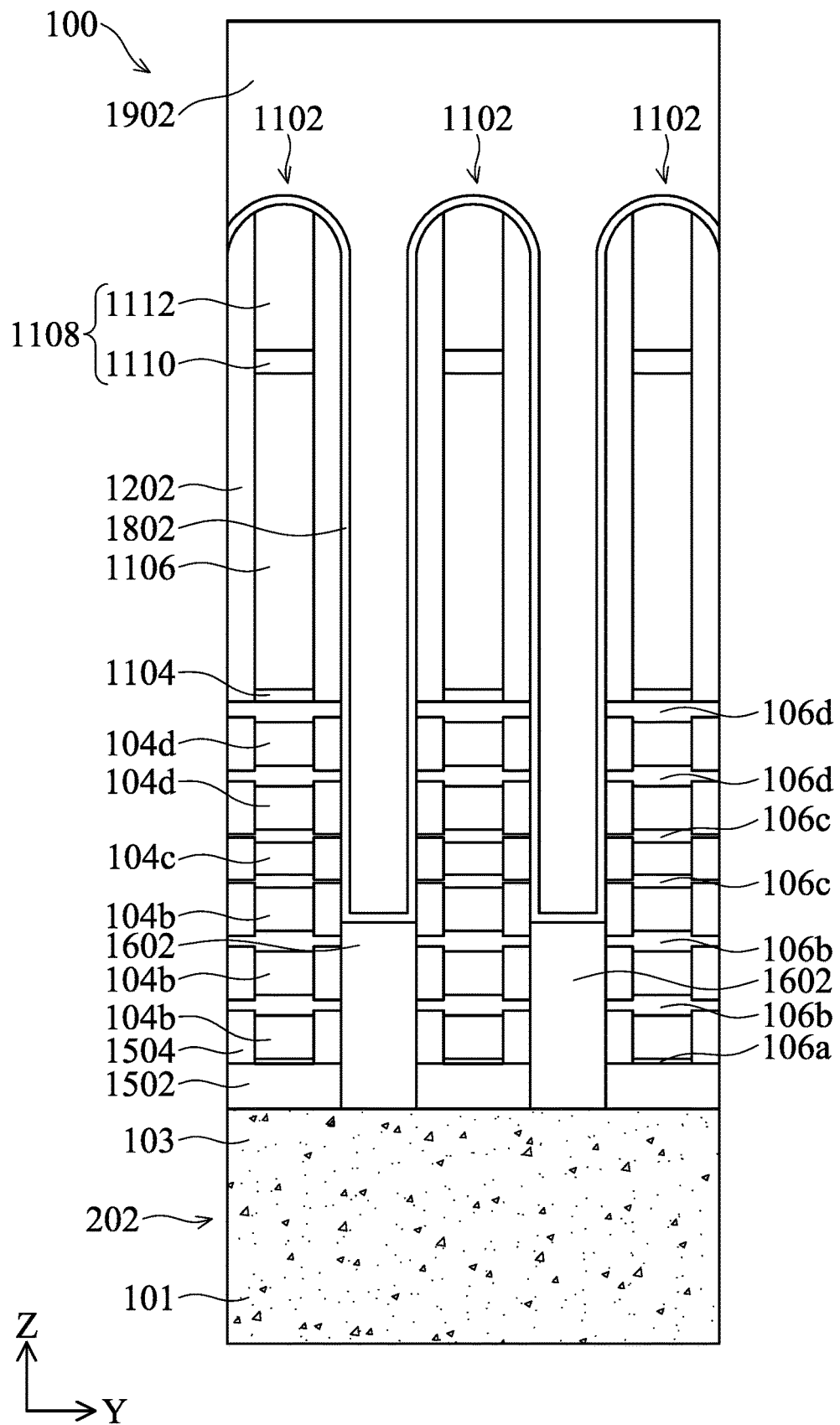

Next, as shown in FIG. 18, a liner 1802 is formed on the exposed surfaces of the semiconductor device structure 100. In some embodiments, the liner 2002 is formed on the S/D epitaxial features 1602, the S/D epitaxial features 1602', the substrate portions 103, the sidewalls of the sacrificial gate stacks 1102, the sidewalls of the exposed second semiconductor layers 106. The liner 2002 may include a semiconductor material, such as Si. In some embodiments, the liner 2002 includes the same material as the second semiconductor layers 106. The liner 2002 may be a conformal layer and may be formed by a conformal process, such as an ALD process. The liner 2002 at different locations shown in FIGS. 20A-20C may be formed by a single process, such as a single ALD process. The liner 1802 may have a thickness ranging from about 0.5 nm to about 1.5 nm, such as about 1 nm. The liner 1802 protects the nitrogen-containing layers 1112, the spacers 1202, the second semiconductor layers 106, the dielectric spacers 1504, and the dielectric layers 1502 during subsequent recess of a dielectric material 1902 (FIG. 19). Thus, if the thickness of the liner 1802 is less than about 0.5 nm, the liner 1802 may not be sufficient to protect the materials. On the other hand, if the thickness of the liner 1802 is greater than about 1.5 nm, the subsequent removal of portions of the liner 1802 may lead to damaging of the second semiconductor layers 106.

Figure 20A:
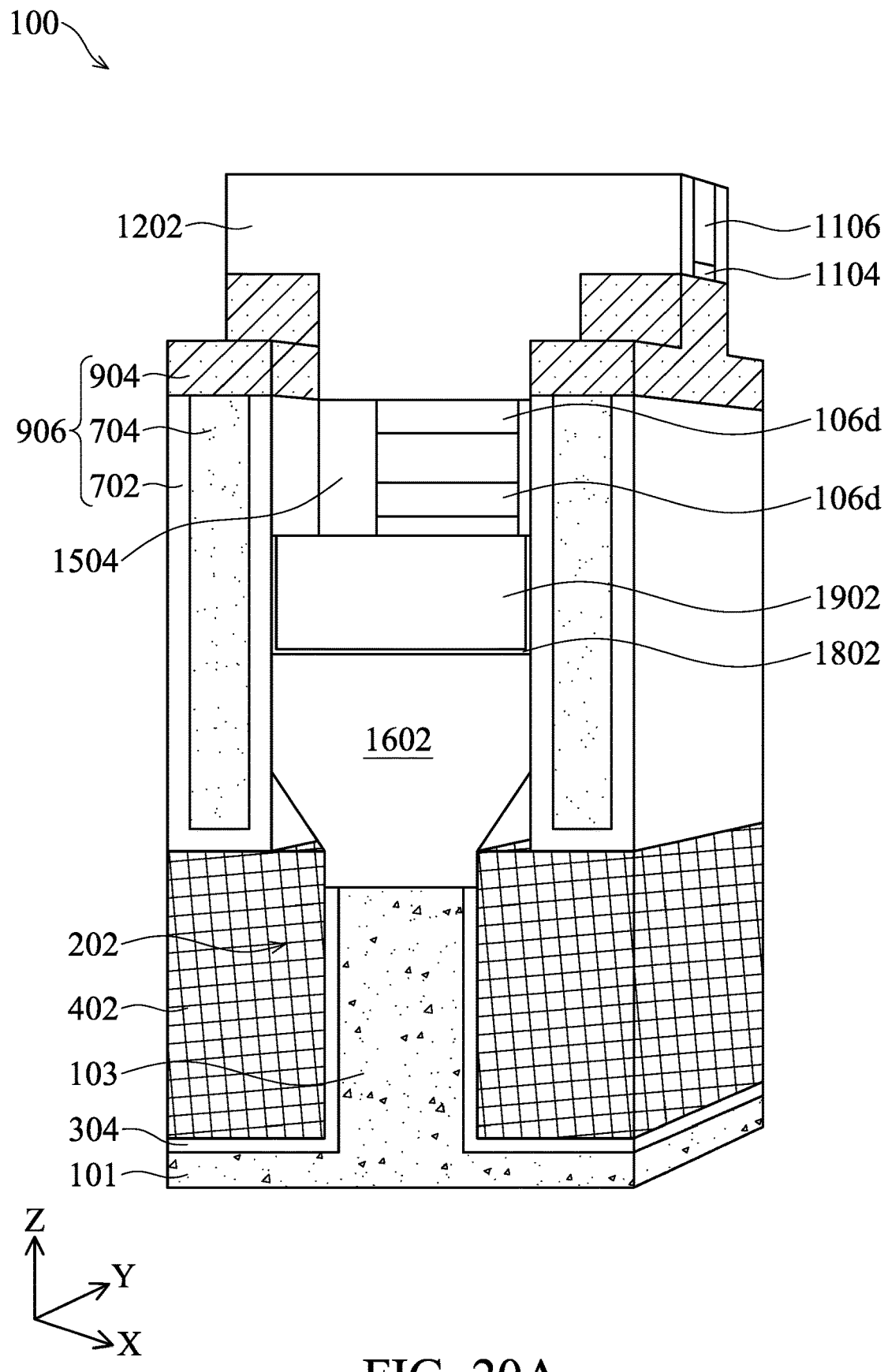
FIG. 20A is a perspective view of a stage of manufacturing the semiconductor device structure, in accordance with some embodiments.
Figure 20B:
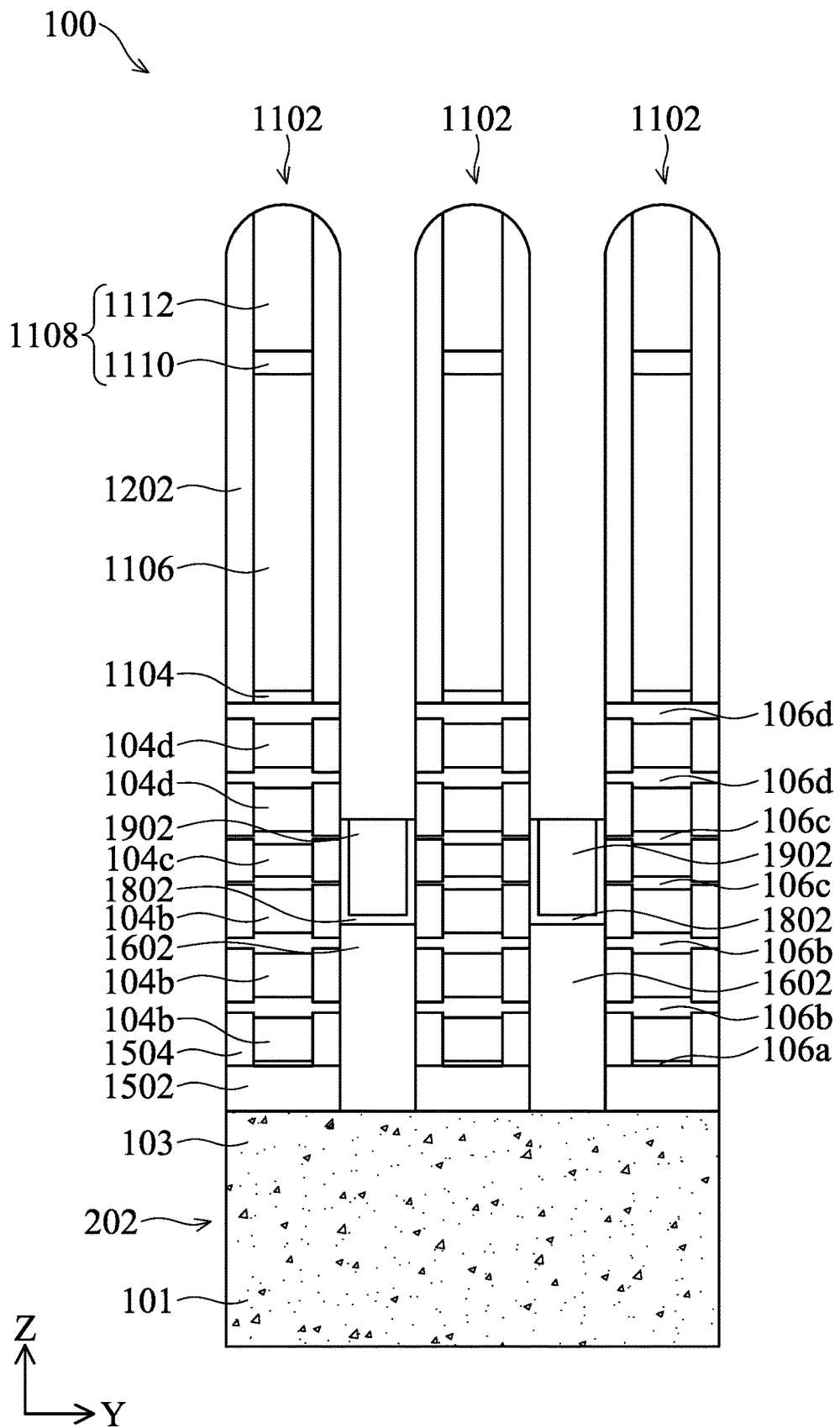
FIG. 20B is a cross-sectional side view of the stage of manufacturing the semiconductor device structure of FIG. 20A taken along line A-A of FIG. 12, in accordance with some embodiments.

Next, as shown in FIG. 19, the dielectric material 1902 is formed on the liner 1802 and over the S/D epitaxial features 1602. The dielectric material 1902 may include the same material as the insulating material 402 and may be formed by the same method as the insulating material 402. In some embodiments, the dielectric material 1902 includes an oxide that is formed by FCVD. The dielectric material 1902 may be recessed to a level below the level of the second semiconductor layers 106d, as shown in FIGS. 20A and 20B. The recess of the dielectric material 1902 may be performed by any suitable process, such as dry etch or wet etch that selectively removes a portion of the dielectric material 1902 but not the liner 1802. Next, the exposed liner 1802 is removed, as shown in FIGS. 20A and 20B. The removal of the exposed liner 1802 may be performed by any suitable process, such as dry etch or wet etch that selectively removes portions of the liner 1802 but not dielectric materials of the nitrogen-containing layer 1112, the spacer 1202, the dielectric material 904, and the dielectric material 1902. Because the thickness of the liner 1802 is less than about 1.5 nm, the etch process removing portions of the liner 1802 may be performed in a short period of time, so the exposed second semiconductor layers 106d are not substantially affected by the etch process.

The remaining liner 1802 may be level with the recessed dielectric material 1902, as shown in FIGS. 20A and 20B. The liner 1802 may be in contact with the second semiconductor layers 106c. The remaining liner 1802 and the recessed dielectric material 1902 may be between adjacent dielectric features 906 along the X direction and between adjacent stacks of second semiconductor layers 106 along the Y direction. In some embodiments, the liner 1802 may be in contact with the liners 702 of adjacent dielectric features 906 and in contact with second semiconductor layers 106c of adjacent fins 202. Furthermore, the liner 1802 may be in contact with the S/D epitaxial feature 1602. Thus, the remaining liner 1802 may surround five surfaces of the recessed dielectric material 1902, as shown in FIGS. 20A and 20B.

Figure 21A:
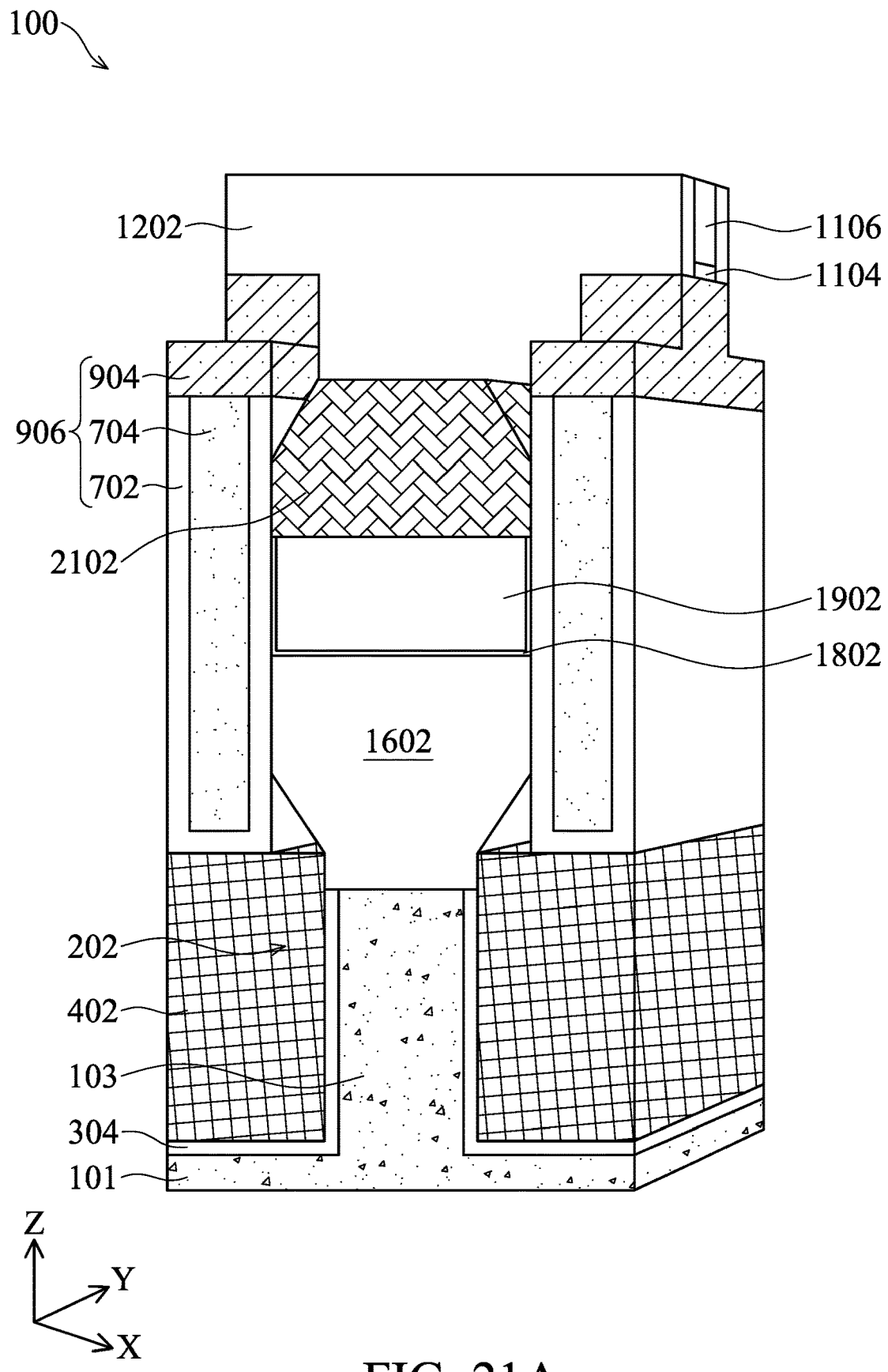
FIG. 21A is a perspective view of a stage of manufacturing the semiconductor device structure, in accordance with some embodiments.
Figure 21B:
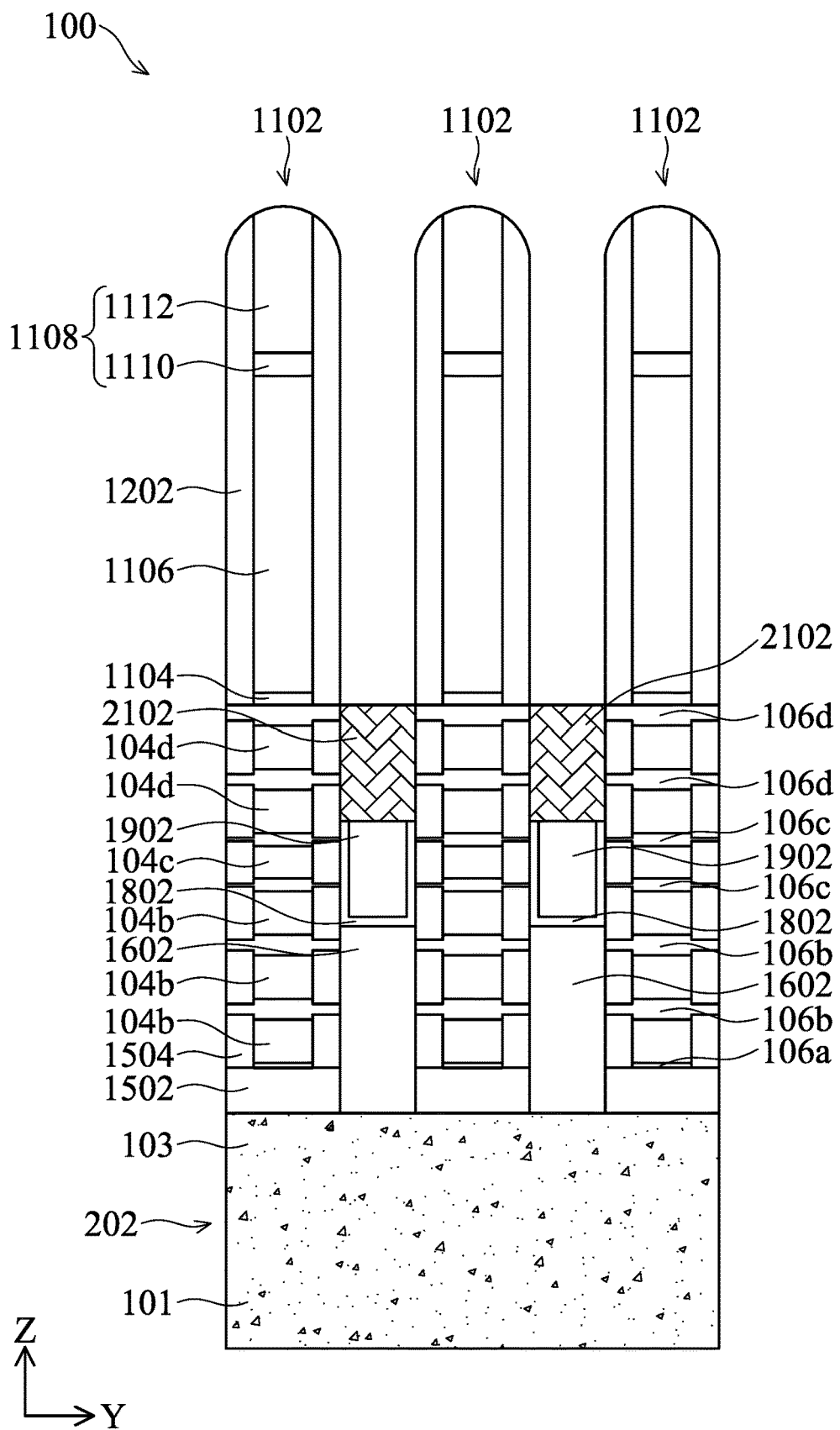
FIG. 21B is a cross-sectional side view of the stage of manufacturing the semiconductor device structure of FIG. 21A taken along line A-A of FIG. 12, in accordance with some embodiments.

Next, as shown in FIGS. 21A and 21B, S/D epitaxial features 2102 are formed on the dielectric material 1902 and the liner 1802. The S/D epitaxial feature 2102 may include one or more layers of Si, SiP, SiC and SiCP for an NFET or Si, SiGe, Ge for a PFET. In some embodiments, the S/D epitaxial features 2102 includes one or more layers of Si, SiP, SiC and SiCP for an NFET. The S/D epitaxial features 2102 may be formed from the second semiconductor layers 106d (FIGS. 20A and 20B). The S/D epitaxial features 2102 may grow both vertically and horizontally to form facets, which may correspond to crystalline planes of the material used for the second semiconductor layers 106d. The S/D epitaxial features 2102 may be formed by an epitaxial growth method using CVD, ALD or MBE. The S/D epitaxial features 2102 may be the S/D regions.

The semiconductor device structure 100 shown in FIGS. 21A and 21B can reduce the area of semiconductor devices, such as SRAMs having NFETs and PFETs. The source regions of the NFETs and PFETs may be vertically stacked, and the drain regions of the NFETs and the PFETs may be vertically stacked to increase the density of the FETs. The source of the NFET and the source of the PFET may be separated by the liner 1802 and the dielectric material 1902. The liner 1802 is used to protect materials during the recessing of the dielectric material 1902, and the thickness of the liner 1802 reduces the risk of damaging the second semiconductor layers 106*d* during the removal of portions of the liner 1802.

Figure 22:
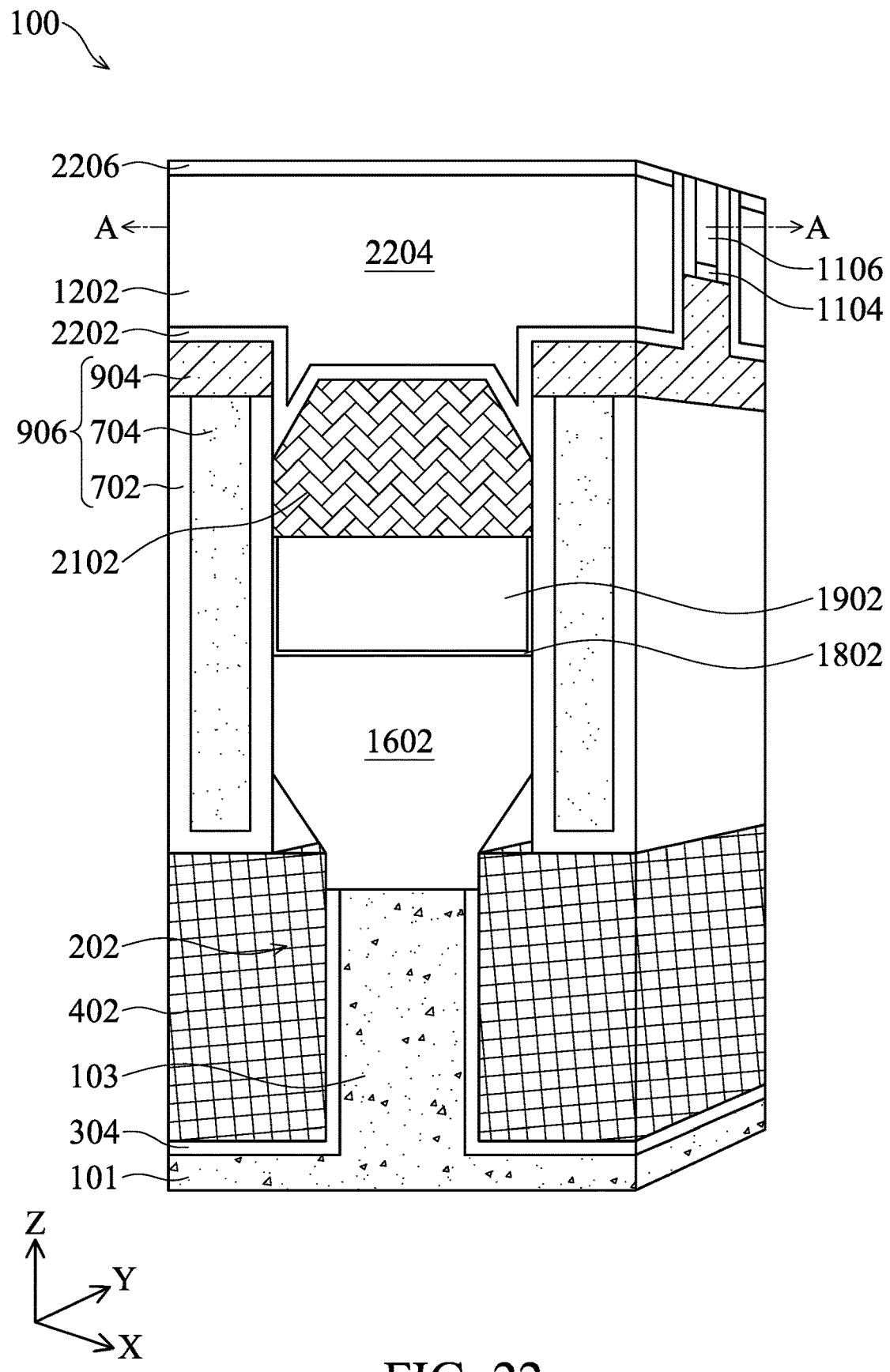
FIG. 22 is a perspective view of a stage of manufacturing the semiconductor device structure, in accordance with some embodiments.

As shown in FIG. 22, a contact etch stop layer (CESL) 2202 may be formed on the S/D epitaxial features 2102, the dielectric features 906, and adjacent the spacers 1202. The CESL 2202 may include an oxygen-containing material or a nitrogen-containing material, such as silicon nitride, silicon carbon nitride, silicon oxynitride, carbon nitride, silicon oxide, silicon carbon oxide, the like, or a combination thereof. The CESL 2202 may be formed by CVD, PECVD, ALD, or any suitable deposition technique. In some embodiments, the CESL 2202 is a conformal layer formed by the ALD process. An interlayer dielectric (ILD) layer 2204 may be formed on the CESL 2202. The materials for the ILD layer 2204 may include tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 2204 may be deposited by a PECVD process or other suitable deposition technique. In some embodiments, after formation of the ILD layer 2204, the semiconductor device structure 100 may be subject to a thermal process to anneal the ILD layer 2204.

A planarization process is performed to expose the sacrificial gate electrode layer 1106. The planarization process may be any suitable process, such as a CMP process. The planarization process removes portions of the ILD layer 2204 and the CESL 2202 disposed on the sacrificial gate stacks 1102. The planarization process may also remove the mask structure 1108. The ILD layer 2204 may be further recessed to a level below the top of the sacrificial gate electrode layer 1106, and a nitrogen-containing layer 2206, such as a SiCN layer, may be formed on the recessed ILD layer 2204, as shown in FIG. 22. The nitrogen-containing layer 2206 may protect the ILD layer 2204 during subsequent etch processes.

Figure 23:
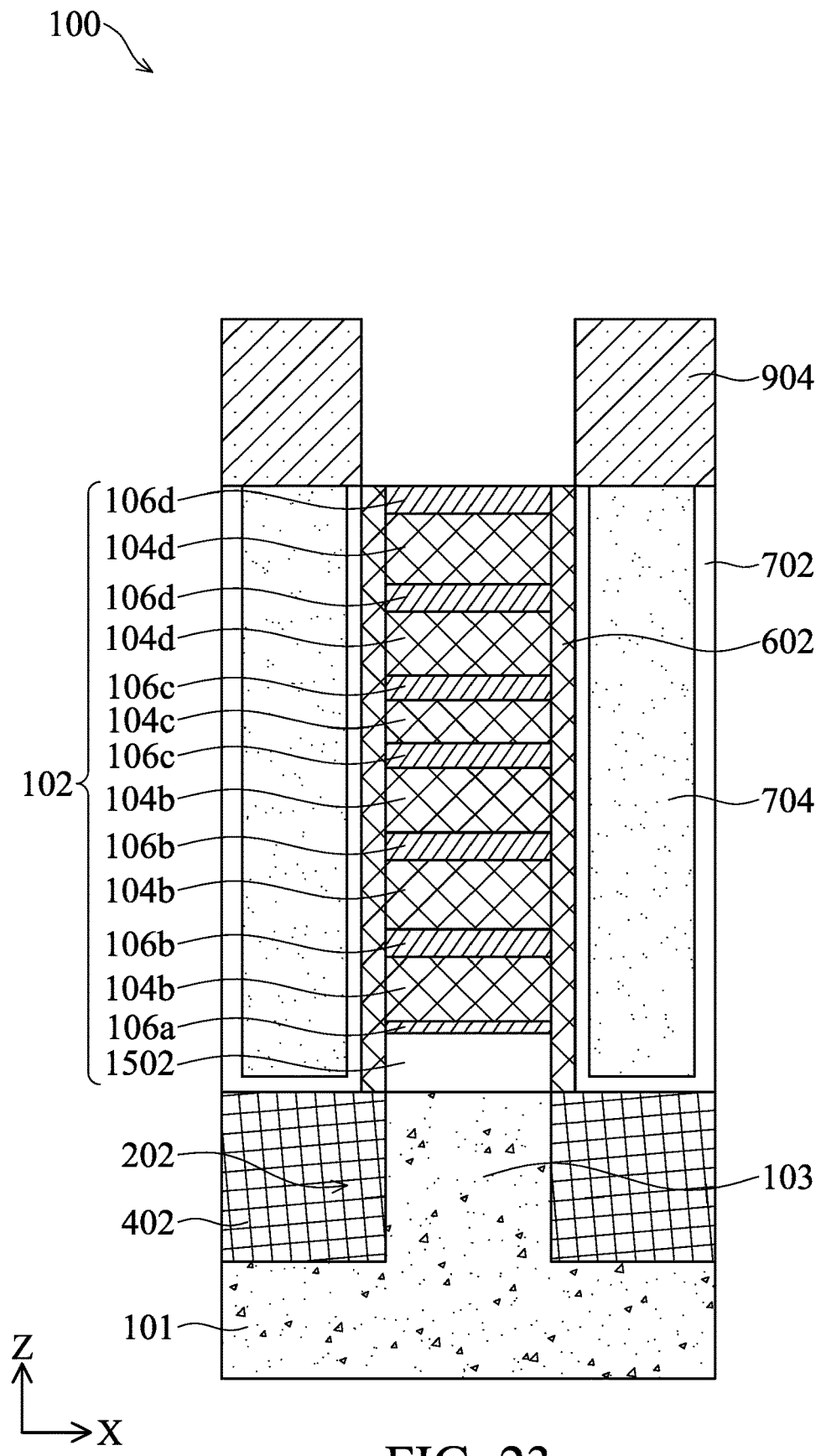
FIGS. 23-27 are cross-sectional side views of various stages of manufacturing the semiconductor device structure, in accordance with some embodiments.

FIGS. 23-27 are cross-sectional side views of various stages of manufacturing the semiconductor device structure 100 taken along line A-A of FIG. 22, in accordance with some embodiments. As shown in FIG. 23, the sacrificial gate electrode layer 1106 and the sacrificial gate dielectric layer 1104 are removed, exposing the cladding layers 602 and the stacks of first semiconductor layers 104. The sacrificial gate electrode layer 1106 may be first removed by any suitable process, such as dry etch, wet etch, or a combination thereof, followed by the removal of the sacrificial gate dielectric layer 1104, which may be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 1106 but not the spacers 1202, the nitrogen-containing layer 2206, the dielectric material 904 of the dielectric features 906, and the CESL 2202. In some embodiments, the spacers 1202 may be recessed by the etchant used to remove the sacrificial gate electrode layer 1106 and/or the sacrificial gate dielectric layer 1104.

Figure 24:
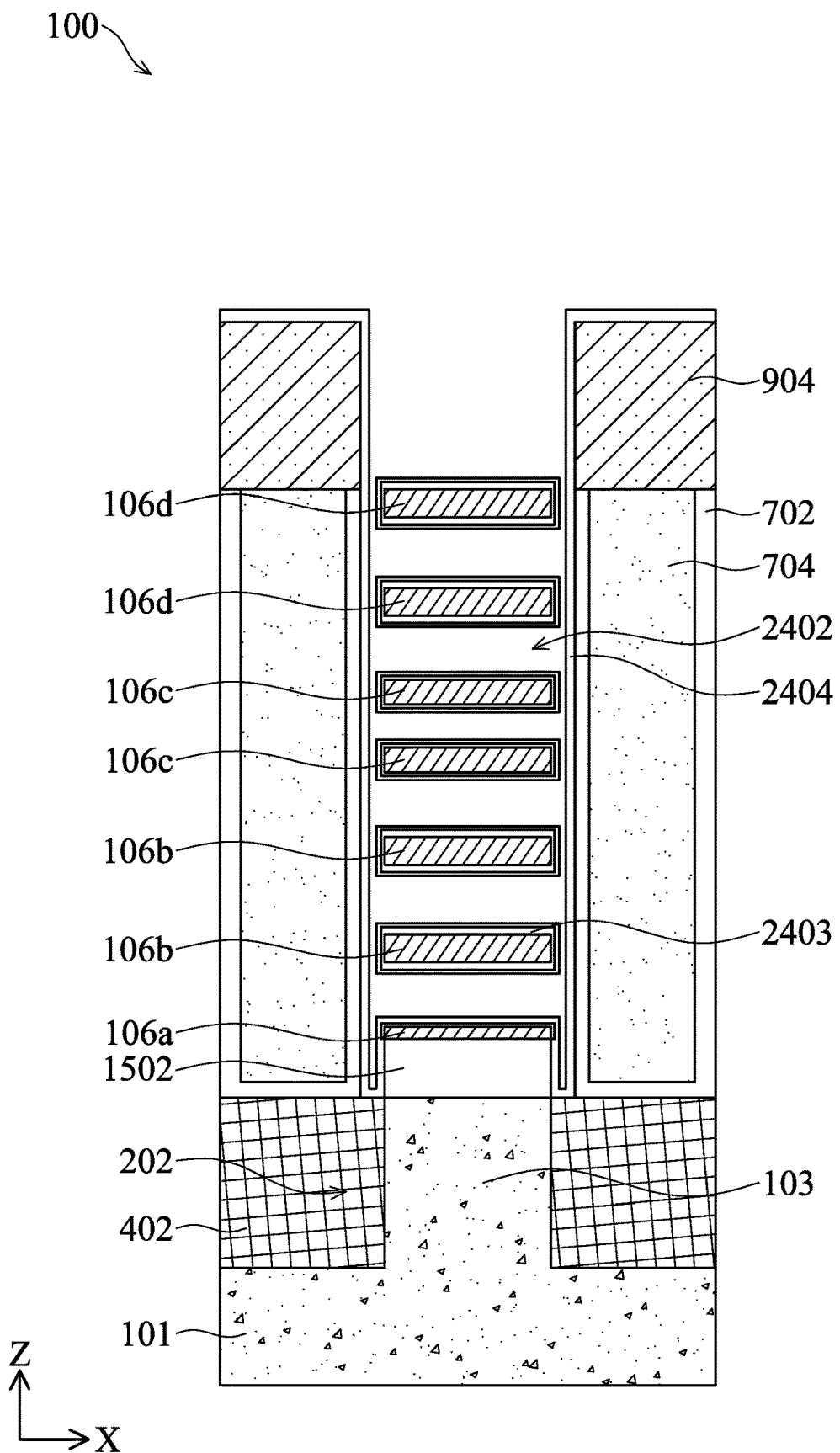

Next, as shown in FIG. 24, the cladding layers 602 and the first semiconductor layers 104 are removed. The removal processes expose the dielectric spacers 1504 (FIG. 15) and the second semiconductor layers 106. The removal process may be any suitable processes, such as dry etch, wet etch, or a combination thereof. The etch process may be a selective etch process that removes the cladding layers 602 and the first semiconductor layers 104 but not the spacers 1202, the CESL 2202, the nitrogen-containing layer 2206, the dielectric material 904, and the second semiconductor layers 106. As a result, openings 2402 are formed, as shown in FIG. 24. The portion of the second semiconductor layers 106 not covered by the dielectric spacers 1504 may be exposed in the openings 2402. Each second semiconductor layer 106*b* may be a nanosheet channel of a first nanosheet transistor, and each second semiconductor layer 106*d* may be a nanosheet channel of a second nanosheet transistor disposed over and aligned with the first nanosheet transistor.

As shown in FIG. 24, oxygen-containing layers 2403 may be formed around the exposed surfaces of the second semiconductor layers 106 in the openings 2402. Gate dielectric layers 2404 are formed on the oxygen-containing layers 2403 and the dielectric features 906 in the openings 2402, as shown in FIG. 24. The oxygen-containing layer 2403 may be an oxide layer, and the gate dielectric layer 2404 may include the same material as the sacrificial gate dielectric layer 1104 (FIG. 11). In some embodiments, the gate dielectric layer 2404 includes a high-k dielectric material. The oxygen-containing layers 2403 and the gate dielectric layers 2404 may be formed by any suitable processes, such as ALD processes. In some embodiments, the oxygen-containing layers 2403 and the gate dielectric layers 2404 are formed by conformal processes.

Figure 25:
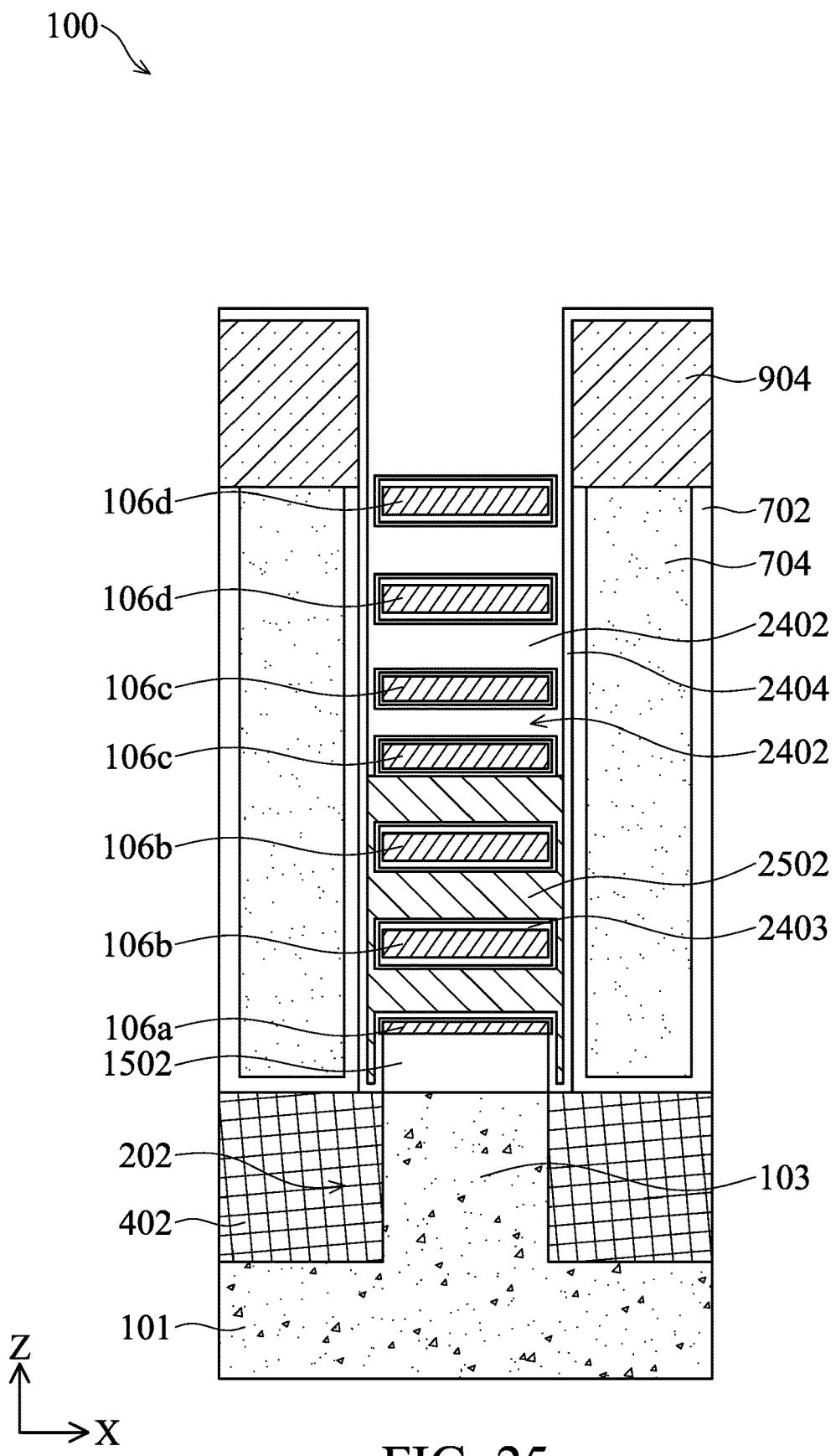

Next, as shown in FIG. 25, a first gate electrode layer 2502 is formed in each opening 2402 and on the gate dielectric layers 2404. The first gate electrode layer 2502 is formed on the gate dielectric layer 2404 to surround a portion of each second semiconductor layer 106*b*. The first gate electrode layer 2502 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The first gate electrode layers 2502 may be formed by PVD, CVD, ALD, electro-plating, or other suitable method. In some embodiments, the first gate electrode layer 2502 includes a p-type gate electrode layer such as TiN, TaN, TiTaN, TiAlN, WCN, W, Ni, Co, or other suitable material, and the first gate electrode layer 2502 is a gate electrode layer of a PFET. The first gate electrode layer 2502 may be formed by first forming a gate electrode layer filling the opening 2402, followed by an etch back process to recess the gate electrode layer to a level just below the bottom-most second semiconductor layer 106*c*, as shown in FIG. 25.

Figure 26:
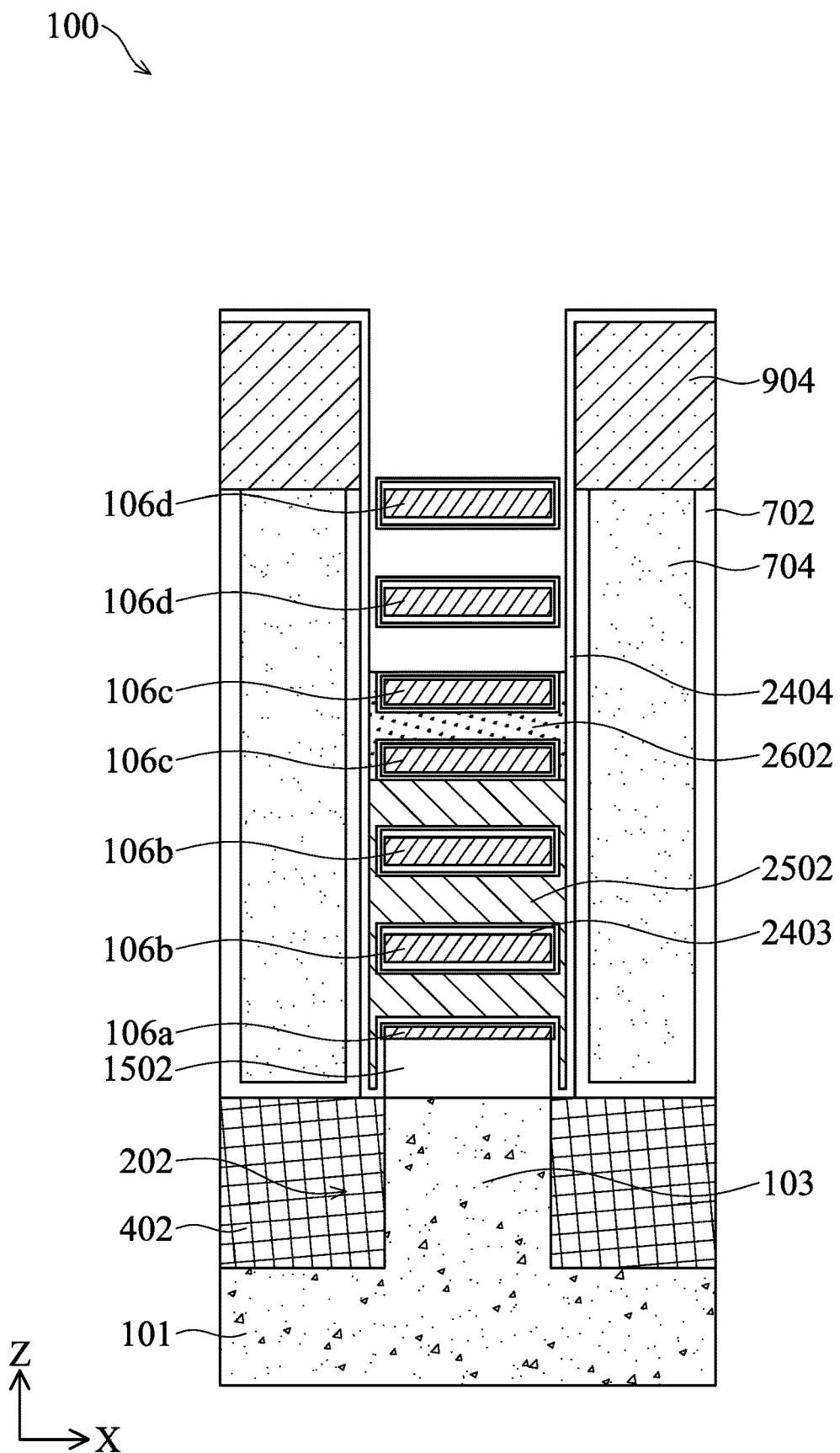

Next, as shown in FIG. 26, an isolation layer 2602 is formed in each opening 2402 and on the first gate electrode layer 2502. The isolation layer 2602 is formed on the gate dielectric layer 2404 to surround a portion of each second semiconductor layer 106*c*. The isolation layer 2602 includes one or more layers of dielectric material, such as a metal oxide, for example a refractory metal oxide. The isolation layer 2602 may be formed by PVD, CVD, PECVD, ALD, electro-plating, or other suitable method. The isolation layer 2602 may be formed by first forming a dielectric layer filling the opening 2402, followed by an etch back process to recess the dielectric layer to a level just above the top-most second semiconductor layer 106*c*, as shown in FIG. 26.

Figure 27:
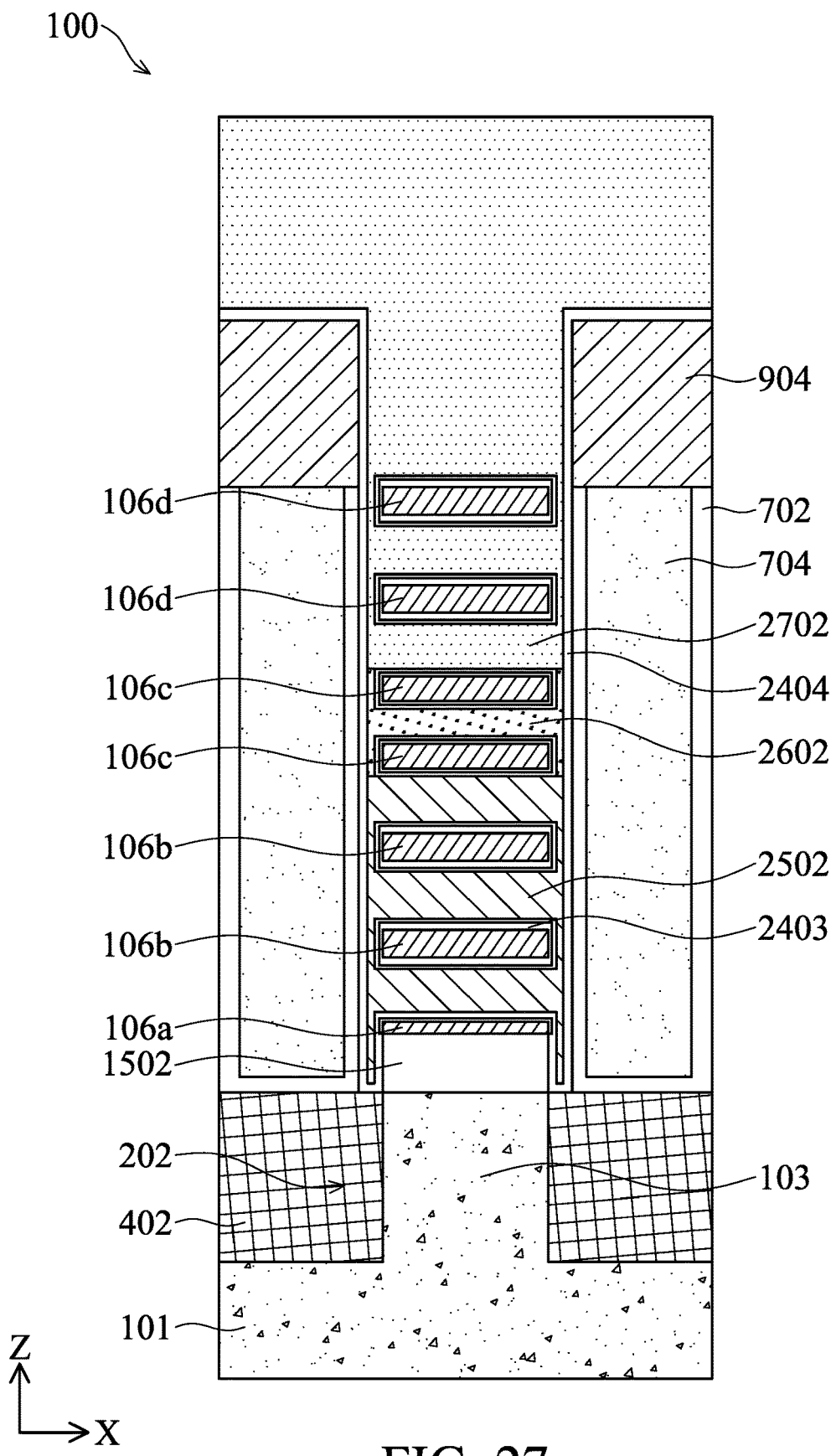

Next, as shown in FIG. 27, a second gate electrode layer 2702 is formed in each opening 2402 and on the isolation layer 2602. The second gate electrode layer 2702 is formed on the gate dielectric layer 2404 to surround a portion of each second semiconductor layer 106d. The second gate electrode layer 2702 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The second gate electrode layers 2702 may be formed by PVD, CVD, ALD, electro-plating, or other suitable method. The first gate electrode layer 2502 and the second gate electrode layer 2702 may include the same material or different materials. In some embodiments, the second gate electrode layer 2702 includes an n-type gate electrode layer such as TiAlC, TaAlC, TiSiAlC, TiC, TaSiAlC, or other suitable material, and the second gate electrode layer 2702 is a gate electrode layer of an NFET.

Next, as shown in FIG. 28A, after forming the second gate electrode layer 2702, openings may be formed in the ILD layer 2204 to expose the S/D epitaxial features 2102, and a conductive feature 2806 may be formed in each opening over the S/D epitaxial feature 2102. A silicide layer 2808 may be formed between the S/D epitaxial feature 2102 and the conductive feature 2806. The conductive feature 2806 may include a material having one or more of Ru, Mo, Co, Ni. W, Ti, Ta, Cu, Al, TiN and TaN, and may be formed by any suitable process, such as PVD, ECP, or CVD. Additional layers or structures may be formed on the semiconductor device structure 100 before flipping over to perform back side processes on the semiconductor device structure 100.

In some embodiments, after flipping over the semiconductor device structure 100, the substrate 101 is removed by any suitable method. In some embodiments, the dielectric layers 1502 (FIG. 27) are removed. A dielectric material 2810 may be formed over the first gate electrode layers 2502 and the S/D epitaxial features 1602. Openings may be formed in the dielectric material 2810, and conductive features 2814, 2818 may be formed in the openings. The conductive features 2814 may be formed over the first gate electrode layers 2502 and may include the same material as the first gate electrode layer 2502. The conductive features 2818 may be formed over the S/D epitaxial features 1602, and the conductive features 2818 may include the same material as the conductive feature 2806. Silicide layers 2820 may be formed between the S/D epitaxial features 1602 and the conductive features 2818. Liners 2812, 2816 may be formed on the sidewall of the openings. The liners 2812 may be in contact with the conductive feature 2814, and the liners 2816 may be in contact with the conductive feature 2818. The liners 2812 may include the same material as the gate dielectric layer 2404, and the liner 2812 may be formed between the conductive feature 2814 and the first gate electrode layer 2502. The liners 2816 may include the same material as the CESL 2202.

FIG. 28B shows a semiconductor device structure 100 according to another embodiment. After forming the second gate electrode layer 2702, openings with different depths may be formed on the front side of the semiconductor device structure 100. For example, in some embodiments, one opening is formed through the S/D epitaxial feature 2102, the dielectric material 1902, and the liner 1802 to expose the S/D epitaxial feature 1602. Another opening may be formed through the ILD layer 2204 to expose the S/D epitaxial feature 2102. Next, a conductive feature 2822 is formed in the opening that exposes the S/D epitaxial feature 1602, and the conductive feature 2806 is formed in the opening that exposes the S/D epitaxial feature 2102. A silicide layer 2824 is formed between the conductive feature 2822 and the S/D epitaxial feature 1602, and the silicide layer 2808 is formed between the conductive feature 2806 and the S/D epitaxial feature 2102. Thus, in some embodiments, one of the source or drain region of the NFET and the PFET may be electrically connected by the conductive feature 2822, while the other of the source or drain region of the NFET and the PFET may be electrically isolated.

Similar to the semiconductor device structure 100 shown in FIG. 28A, the semiconductor device structure 100 may also subject to back side processes after additional layers and structures being formed on the front side. For example, the substrate 101 may be removed and replaced with the dielectric material 2810, and conductive features 2814 may be formed in the dielectric material 2810. The conductive features 2814 may be in contact with liners 2812. Unlike the semiconductor device structure 100 shown in FIG. 28A, the conductive features 2818 and the liners 2816 are replaced with a dielectric material 2826, as shown in FIG. 28B. The dielectric material 2826 may include the same material as the dielectric material 1902. In some embodiments, the dielectric material 2826 may not be present by not forming an opening in the dielectric material 2810.

The present disclosure provides a semiconductor device structure 100 including a CFET having a first FET and a second FET disposed over the first FET. The first FET may be a PFET and the second FET may be an NFET. The source regions of the NFETs and PFETs may be vertically stacked, and the drain regions of the NFETs and the PFETs may be vertically stacked. The source of the NFET and the source of the PFET may be separated by the liner 1802 and the dielectric material 1902. Some embodiments may achieve advantages. For example, the liner 1802 is used to protect materials during the recessing of the dielectric material 1902, and the thickness of the liner 1802 reduces the risk of damaging the second semiconductor layers 106d during the removal of portions of the liner 1802. Furthermore, with the semiconductor device structure 100, device density is increased.

An embodiment is a semiconductor device structure. The structure includes a stack of semiconductor layers spaced apart from and aligned with each other, a first source/drain epitaxial feature in contact with a first one or more semiconductor layers of the stack of semiconductor layers, and a second source/drain epitaxial feature disposed over the first source/drain epitaxial feature. The second source/drain epitaxial feature is in contact with a second one or more semiconductor layers of the stack of semiconductor layers. The structure further includes a first dielectric material disposed between the first source/drain epitaxial feature and the second source/drain epitaxial feature and a first liner disposed between the first source/drain epitaxial feature and the second source/drain epitaxial feature. The first liner is in contact with the first source/drain epitaxial feature and the first dielectric material.

Another embodiment is a semiconductor device structure. The structure includes a first field effect transistor having a first source epitaxial feature and a first drain epitaxial feature. The structure further includes a second field effect transistor disposed over the first field effect transistor. The second field effect transistor includes a second source epitaxial feature disposed over and aligned with the first source epitaxial feature and a second drain epitaxial feature disposed over and aligned with the first drain epitaxial feature. The structure further includes a first dielectric material disposed between the first source epitaxial feature and the second source epitaxial feature and a first liner disposed between the first source epitaxial feature and the second source epitaxial feature. The first liner is in contact with the first source epitaxial feature and the first dielectric material.

A further embodiment is a method. The method includes forming a stack of semiconductor layers, forming a first source/drain epitaxial feature in contact with a first one or more semiconductor layers of the stack of semiconductor layer, forming a liner on and in contact with the first source/drain epitaxial feature, forming a dielectric material on the liner; recessing the dielectric material to expose portions of the liner, removing the exposed portions of the liner, and forming a second source/drain epitaxial feature on and in contact with the liner and the dielectric material.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:
1. A semiconductor device structure, comprising:
a stack of semiconductor layers spaced apart from and aligned with each other;
a first source/drain epitaxial feature in contact with a first one or more semiconductor layers of the stack of semiconductor layers;
a second source/drain epitaxial feature disposed over the first source/drain epitaxial feature, wherein the second source/drain epitaxial feature is in contact with a second one or more semiconductor layers of the stack of semiconductor layers;
a dielectric material disposed between the first source/drain epitaxial feature and the second source/drain epitaxial feature; and
a liner disposed between the first source/drain epitaxial feature and the second source/drain epitaxial feature, wherein the liner is a conformal layer and is in contact with the dielectric material, and the liner is U-shaped.

2. The semiconductor device structure of claim 1, wherein the second source/drain epitaxial feature is in contact with the dielectric material and the liner.

3. The semiconductor device structure of claim 2, wherein the stack of semiconductor layers comprises a third one or more semiconductor layers.

4. The semiconductor device structure of claim 3, wherein the third one or more semiconductor layers are disposed between the first one or more semiconductor layers and the second one or more semiconductor layers.

5. The semiconductor device structure of claim 3, wherein the first, second, and third one or more semiconductor layers of the stack of semiconductor layers each comprises two semiconductor layers.

6. The semiconductor device structure of claim 3, wherein a thickness of the third one or more semiconductor layers is substantially less than a thickness of the first or second one or more semiconductor layers.

7. The semiconductor device structure of claim 1, further comprising:

a first gate electrode layer surrounding at least one semiconductor layer of the first one or more semiconductor layers; and
a second gate electrode layer surrounding at least one semiconductor layer of the second one or more semiconductor layers, wherein the second gate electrode layer is disposed over the first gate electrode layer.

8. The semiconductor device structure of claim 1, further comprising a conductive feature extending through the first source/drain epitaxial feature, the dielectric material, and the liner.

9. A semiconductor device structure, comprising:
a first field effect transistor, comprising:
a first source/drain epitaxial feature; and
a second source/drain epitaxial feature;
a second field effect transistor disposed over the first field effect transistor, wherein the second field effect transistor comprises:
a third source/drain epitaxial feature disposed over the first source/drain epitaxial feature; and
a fourth source/drain epitaxial feature disposed over the second source/drain epitaxial feature;
a dielectric material disposed between the first source/drain epitaxial feature and the third source/drain epitaxial feature; and
a liner surrounding more than one surface of the dielectric material, wherein the liner is U-shaped.

10. The semiconductor device structure of claim 9, wherein the liner surrounds five surfaces of the dielectric material.

11. The semiconductor device structure of claim 9, further comprising:
a first conductive feature disposed over the third source/drain epitaxial feature; and
a second conductive feature disposed over the fourth source/drain epitaxial feature.

12. The semiconductor device structure of claim 11, further comprising:
a first silicide layer disposed between and in contact with the first conductive feature and the third source/drain epitaxial feature; and
a second silicide layer disposed between and in contact with the second conductive feature and the fourth source/drain epitaxial feature.

13. The semiconductor device structure of claim 12, further comprising:
a third conductive feature disposed below the first source/drain epitaxial feature; and
a fourth conductive feature disposed below the second source/drain epitaxial feature.

14. The semiconductor device structure of claim 13, further comprising:
a third silicide layer disposed between and in contact with the third conductive feature and the first source/drain epitaxial feature; and
a fourth silicide layer disposed between and in contact with the fourth conductive feature and the second source/drain epitaxial feature.

15. The semiconductor device structure of claim 9, further comprising a conductive feature extending through the third source/drain epitaxial feature.

16. The semiconductor device structure of claim 15, wherein the conductive feature extends through the liner and the dielectric material.

17. A method, comprising:
forming a stack of semiconductor layers over a substrate;

forming a first source/drain epitaxial feature over the substrate;

forming a liner on and in contact with the first source/drain epitaxial feature;

forming a dielectric material on the liner;

recessing the dielectric material to expose portions of the liner;

removing the exposed portions of the liner, wherein a remaining portion of the liner is U-shaped; and forming a second source/drain epitaxial feature over the first source/drain epitaxial feature, wherein the second source/drain epitaxial feature is formed from one or more semiconductor layers of the stack of semiconductor layers.

18. The method of claim 17, wherein the forming the first source/drain epitaxial feature comprises growing the first source/drain epitaxial feature to a first height and recessing the first source/drain epitaxial feature to a second height less than the first height.

19. The method of claim 18, wherein the first source/drain epitaxial feature at the first height is in contact with the stack of semiconductor layers.

20. The method of claim 17, wherein the liner is formed by an atomic layer deposition process.

* * * * *